United States Patent [19]
Raasch et al.

[11] Patent Number: 5,642,110
[45] Date of Patent: Jun. 24, 1997

[54] MEMORY MAPPED KEYBOARD CONTROLLER

[75] Inventors: Charles F. Raasch, El Toro; Jason S. M. Kim, Los Angeles, both of Calif.

[73] Assignee: AST Research, Inc., Irvine, Calif.

[21] Appl. No.: 312,685

[22] Filed: Sep. 27, 1994

Related U.S. Application Data

[63] Continuation of Ser. No. 137,623, Oct. 15, 1993, abandoned, which is a continuation of Ser. No. 612,810, Nov. 9, 1990, Pat. No. 5,280,283.

[51] Int. Cl.$^6$ ........................................... H04Q 1/00
[52] U.S. Cl. .................. 341/26; 400/479; 364/709.12
[58] Field of Search ............................ 341/23, 26, 22; 364/187, 707, 709.12; 400/479; 395/750

[56] References Cited

U.S. PATENT DOCUMENTS

| | | |
|---|---|---|
| 4,266,278 | 5/1981 | Ebihara et al. . |
| 4,277,780 | 7/1981 | Sanderman et al. ................. 341/26 |
| 4,305,065 | 12/1981 | Mogi . |
| 4,409,665 | 10/1983 | Tubbs . |
| 4,590,556 | 5/1986 | Berger et al. . |
| 4,591,833 | 5/1986 | Ishii et al. . |
| 4,679,166 | 7/1987 | Berger et al. . |
| 4,698,748 | 10/1987 | Juzswik et al. . |
| 4,703,420 | 10/1987 | Irwin . |
| 4,716,526 | 12/1987 | Mori et al. . |
| 4,757,505 | 7/1988 | Marrington et al. . |
| 4,758,945 | 7/1988 | Remedi . |
| 4,841,440 | 6/1989 | Yonezu et al. . |
| 4,851,987 | 7/1989 | Day . |
| 4,888,680 | 12/1989 | Sander et al. . |
| 4,942,606 | 7/1990 | Kaiser et al. . |
| 4,943,911 | 7/1990 | Kopp et al. . |
| 4,945,473 | 7/1990 | Hotley et al. . |

(List continued on next page.)

FOREIGN PATENT DOCUMENTS

| | | |
|---|---|---|
| 204170 | 11/1983 | Denmark . |
| 2012461 | 7/1979 | United Kingdom . |
| 8809008 | 11/1988 | WIPO . |

OTHER PUBLICATIONS

Translation of Abstract of Japanese Publication No. 3136143 Sep. 9, 1991; Mamoru.

Dr. Dobb's Journal, No. 76, Hank Harrison. "CP/M-80 Expansion Card for the Victor 9000 and IBM PC", pp. 58–59 and 61 (note specifically p. 59 top left column). Feb. 1983.

Elector Electronics, vol. 17, No. 185, Canterbury GB, pp. 50–51, Kyte. "8031 In-Circuit Emulator", Jan. 1991.

Intel 82347 Power Management PC Peripheral Preliminary Data Sheet, May 1990.

*Microprocessor Peripherals UPI™–41A/41AH/42/42AH Users Manual*, Intel® Corporation, 1989.

*80C51SL–AG Keyboard Controller*, Intel® Corporation, Sep. 1990.

*80C51SL–BG Keyboard Controller*, Intel® Corporation, Feb. 1991.

*Primary Examiner*—Brian Zimmerman
*Attorney, Agent, or Firm*—Knobbe, Martens, Olson & Bear LLP

[57] ABSTRACT

A memory mapped keyboard controller within a peripheral controller for use in an Industry Standard Architecture (ISA) computer provides a method and apparatus for efficiently monitoring and reading a keyboard switch matrix. In a first mode of operation, the controller activates all the columns and monitors all the rows in the switch matrix to detect when any one or more of the rows becomes active, indicating that at least one key on the keyboard has been pressed. When any row in the matrix is detected as active, then the keyboard controller enters a second mode wherein it selectively activates individual columns and monitors the rows in the switch matrix to detect which row and column contain the activated switch. When the switch location is determined, this location is interpreted by the keyboard controller into a scan code for the ISA computer.

7 Claims, 13 Drawing Sheets

U.S. PATENT DOCUMENTS

| | | |
|---|---|---|
| 4,959,860 | 9/1990 | Watters et al. . |
| 4,980,836 | 12/1990 | Carter et al. . |
| 5,038,275 | 8/1991 | Dujari . |
| 5,041,964 | 8/1991 | Cole et al. . |
| 5,083,266 | 1/1992 | Watanabe .................................. 395/750 |
| 5,237,692 | 8/1993 | Raasch et al. . |
| 5,261,114 | 11/1993 | Raasch et al. . |

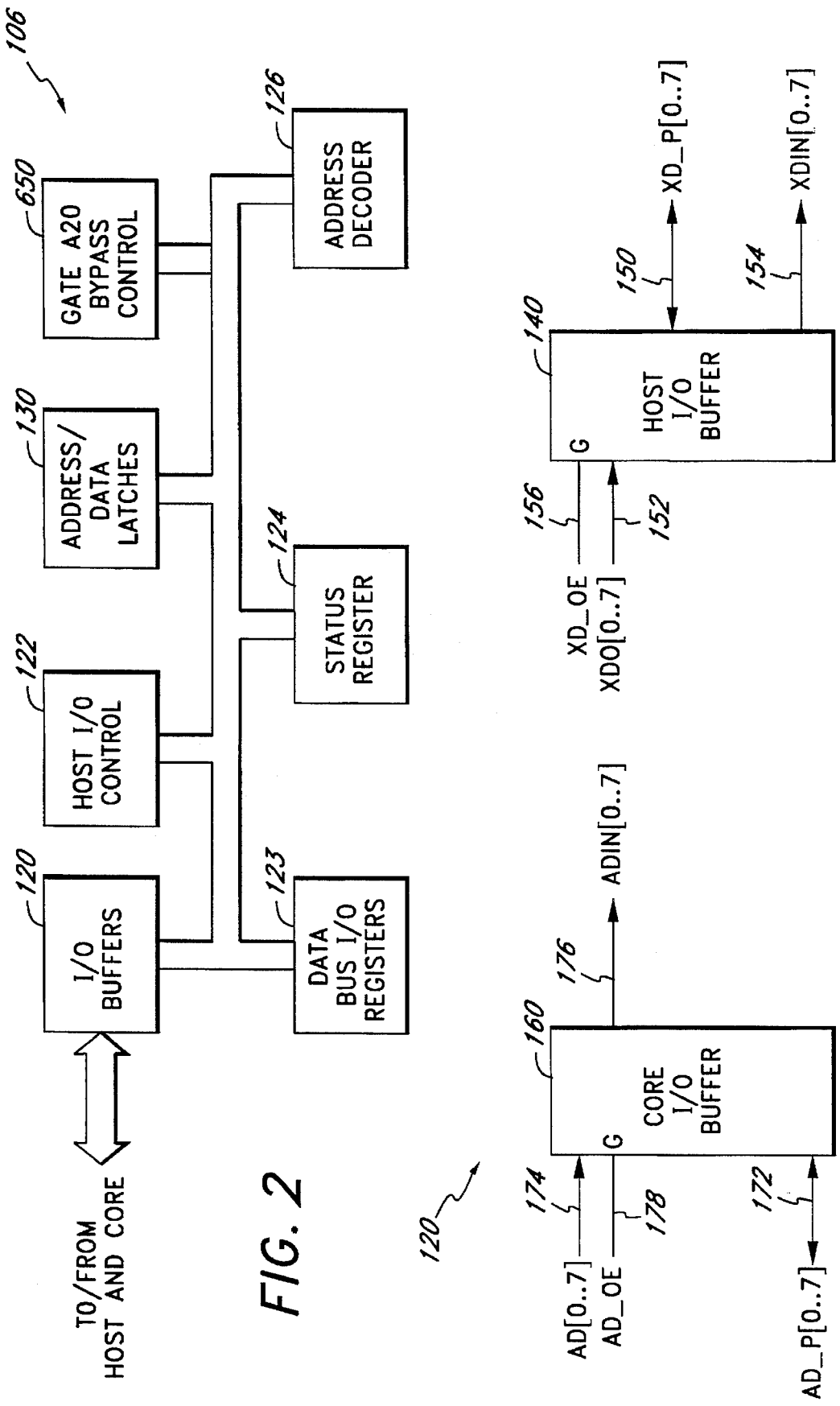

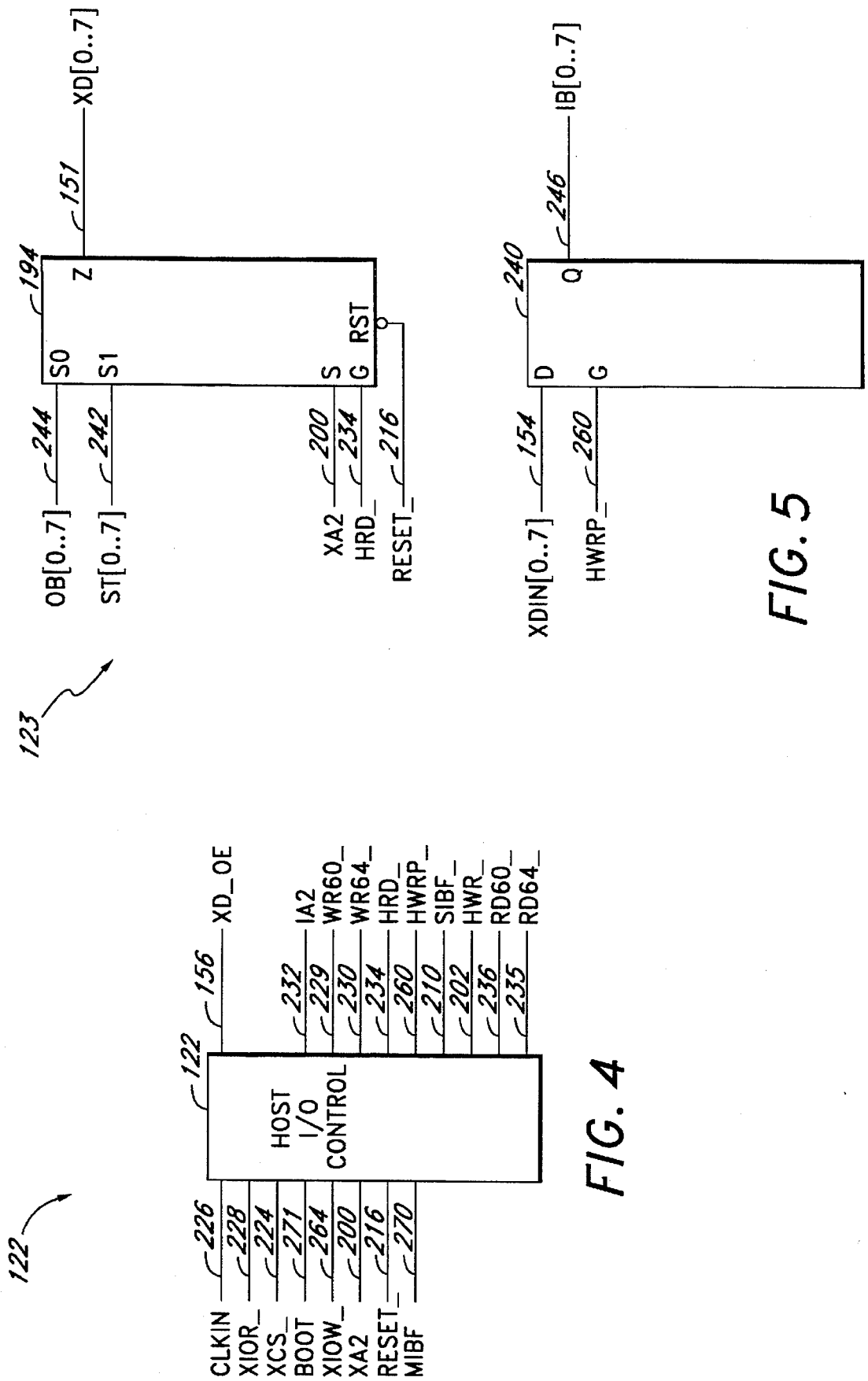

MEMORY MAPPED KEYBOARD CONTROLLER

This application is a continuation of application Ser. No. 08/137,623, filed on Oct. 15, 1993 now abandoned, which was a continuation application of Ser. No. 07/612,810, filed Nov. 9, 1990 and is now U.S. Pat. No. 5,280,283, issued Jan. 18, 1994, and is entitled MEMORY MAPPED KEYBOARD CONTROLLER.

BACKGROUND OF THE INVENTION

1. Field of the Invention

The present invention relates to facilitating control within Industry Standard Architecture (ISA) compatible laptop computers. Specifically, the invention involves a way to alter conventional keyboard scanning methods to more efficiently read a keyboard which is an integral part of the computer.

2. Description of the Related Art

Conventional ISA (i.e. IBM-AT) compatible computers utilize an integrated circuit (IC) intelligent peripheral microcontroller to perform various control functions between a master processor (the host—the master central processing unit and supporting resources) and various peripheral devices. Typical I/O functions performed by the peripheral microcontroller involve scanning a keyboard and providing an interface between peripheral devices and the host. The microcontroller interfaces these peripheral devices with the standard ISA data and control busses. The microcontroller provides registers which enable it to function as one peripheral device to the master processor. The microcontroller performs the basic I/O functions for other peripheral devices so the host does not have to use processor time to perform these functions. The host only communicates with the peripheral microcontroller which performs the processing necessary to support the other peripheral devices.

The INTEL 8042 and 8742 integrated circuits are common peripheral microcontrollers for the ISA compatible computer architecture. The use of the 8042 and the 8742 integrated circuits in laptop computers is undesirable because these integrated circuits utilize older technology which consumes too much power. For instance, the INTEL 8742 is a 50 mA IC. Moreover, these IC's operate in a continuous active mode in which they continuously poll an input register flag to determine if the host has written data to the input register of the peripheral controller, a keyboard, mouse clock and data signals to determine if the mouse has moved, and other I/O peripheral devices to determine if data needs to be transferred.

In laptop computers which can operate on rechargeable batteries, any reduction in power consumption results in an increase in battery life (i.e. time between battery recharging). However, most presently available laptops continue to utilize the conventional peripheral microcontrollers.

It is therefore desirable to provide a controller for use in laptop computers which consumes substantially less power than the conventional peripheral microcontrollers.

Newer technologies, such as CMOS (complementary metal oxide semiconductor) exist which allow design of application specific integrated circuits (ASIC) which consume less power than the conventional peripheral microcontroller. Simply implementing the conventional controller with CMOS technology would decrease power consumption. However, the inefficient active polling of conventional peripheral controllers would continue to consume more power than is desirable because CMOS circuits consume more power when active than when idle.

Moreover, under the conventional design, the keyboard requires an additional IC to scan the keyboard matrix to determine if a key has been pressed. The keyboard scanner then determines which key has been pressed and converts the key position into a scan code for transmission to the conventional peripheral microcontroller. The peripheral controller then forwards the scan code to the host. The extra keyboard scanner IC consumes further power which is undesirable.

Therefore, it is further desirable to eliminate the separate IC which scans the keyboard and generates scan codes for the peripheral microcontroller. Advantageously, the peripheral controller provides all the keyboard control and only scans the keyboard when a key has been pressed. This reduces the power consumption of the computer, and thereby, extends battery life.

SUMMARY OF THE INVENTION

The present invention provides a relatively low power peripheral controller which utilizes memory mapped address decode architecture to expand I/O control ports and enhance interrupt service capabilities to allow a single chip to control many laptop computer applications. Extensive power management capabilities have been added to the microcontroller to conserve power to extend the battery life of a laptop computer.

The controller emulates the functions of the previous peripheral microcontrollers so that software written for a conventional ISA computer will operate on computers incorporating the present invention. The controller also contains a new keyboard scanner controller that operates on an interrupt basis to conserve power rather than continuously scanning the keyboard. The present keyboard scanner also provides a system for mapping a keyboard switch matrix into memory or I/O space of the host such that multiple keys can be read in a single machine cycle.

One aspect of the invention involves a memory mapped keyboard scanner for a peripheral controller for use in a host Industry Standard Architecture compatible computer system wherein the peripheral controller has a core microprocessor having addressable memory space. The peripheral controller of the present invention emulates the functions conventionally performed by the INTEL 8042 or 8742 series of integrated circuits. The peripheral controller comprises a keyboard switch matrix with a plurality of columns and a plurality of rows with a keyboard row data bus connected to the rows. The controller further comprises a controller which selectively activates all of the columns and monitors all of the rows in a first mode to detect when at least one of the rows becomes active because a key has been pressed. Once the controller detects at least one active row, it enters a second mode and selectively activates individual columns in the switch matrix one at a time and monitors all of the rows to detect the individual column and row of the active key or keys in the keyboard switch matrix. The peripheral controller also comprises an address bus which provides signals for the peripheral controller to activate all of the columns in the said first mode, or individual columns one at a time in the second mode.

This invention provides a memory or I/O space mapped keyboard scanner which allows multiple keys to be read in a single machine cycle by activating the columns in the switch matrix one at a time and then reading the row data bus with one instruction executed by the core microprocessor.

BRIEF DESCRIPTION OF THE DRAWINGS

FIG. 2 is a block diagram of the host interface of the system.

FIG. 3 is a diagram of the host and core (input/output) I/O buffers.

FIG. 4 illustrates the host I/O control block.

FIG. 5 illustrates the data bus register buffers for the host.

DETAILED DESCRIPTION OF THE PREFERRED EMBODIMENT

The present invention will be described in the context of component oriented logic with an independent microprocessor. In a preferred embodiment, the entire system is implemented in an application specific integrated circuit (ASIC) which includes the microprocessor within the ASIC.

Figure 1:
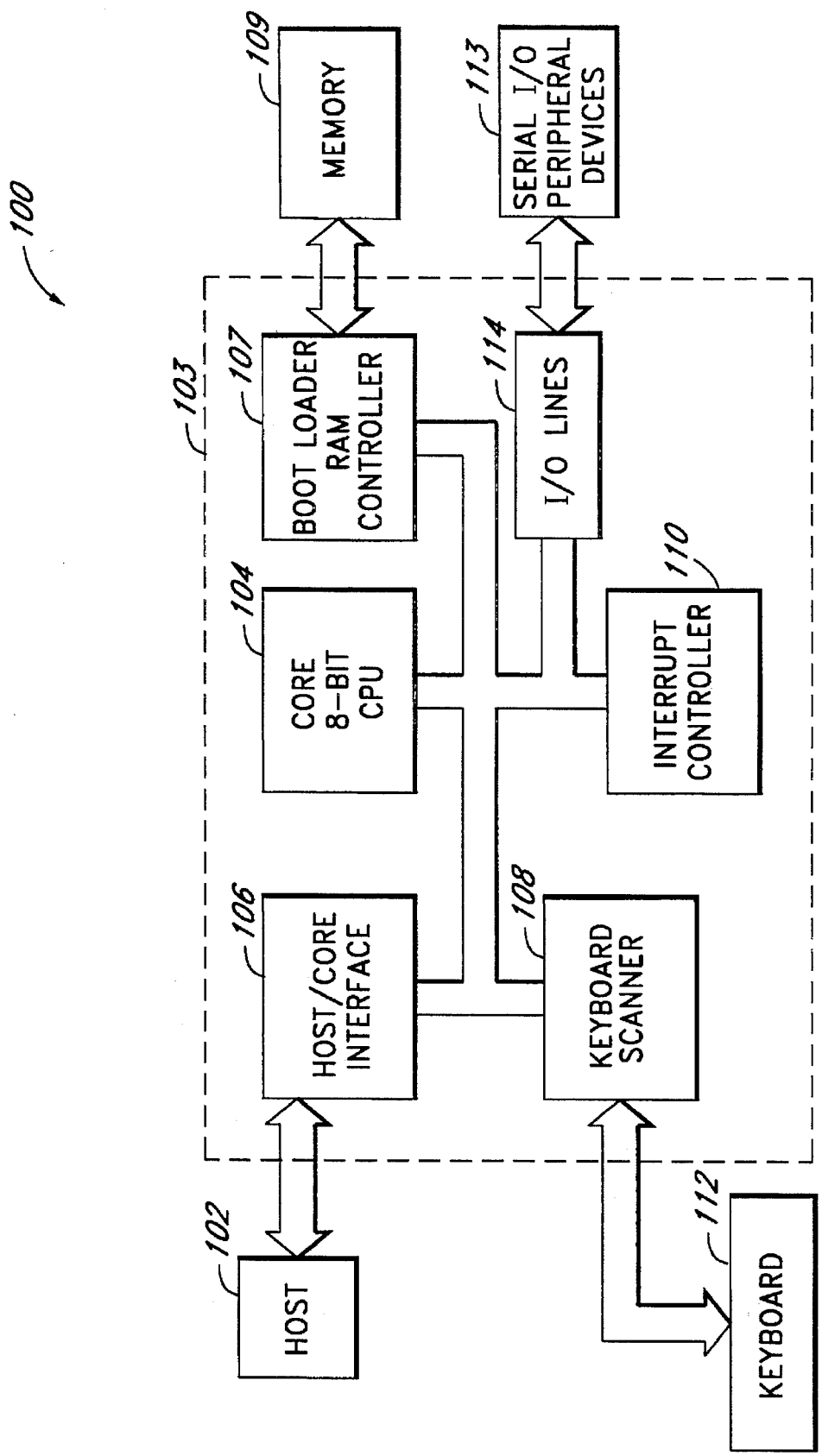
FIG. 1 is a block diagram of the peripheral controller system according to the present invention.

The block diagram of FIG. 1 illustrates the principal system units of the present invention. The computer system 100 comprises a master processor and supporting platform resources (the host) 102 such as an INTEL 80x86 motherboard, a peripheral controller 103, a memory 109, a keyboard 112, and serial input/output (I/O) peripheral devices 113. The peripheral controller 103 includes a microcontroller core central processing unit (CPU) 104, a host/core interface 106, a boot loader and RAM controller circuit 107, a keyboard scanner 108, an interrupt controller 110, and I/O lines 114 connected to the serial I/O devices 113.

The peripheral controller 103 emulates a conventional peripheral microcontroller such as an INTEL 8042 or 8742 and performs additional functions discussed herein. The peripheral microcontroller 103 described can be implemented in a low power CMOS application specific integrated circuit (ASIC).

The Microcontroller Core

The microcontroller core CPU 104 comprises, or emulates the functions of, an INTEL 80C31 family microcontroller as is well understood in the art. The core CPU 104 is programmed to manage the operations of the peripheral controller 103.

The Host/Core Interface

The host/core interface 106 comprises a number of different functional blocks. These blocks are shown in FIG. 2, and include a set of tri-state input/output (I/O) buffers 120, host I/O control 122, data bus I/O register buffers 123, a status register 124, an address decoder/bus multiplexer circuit 126, address/data bus latches 130, and a gate A20 bypass controller 650.

The I/O Buffers

The tri-state I/O buffers 120, depicted in FIG. 3, include a host I/O buffer 140 and a microcontroller core I/O buffer 160. These buffers 140 and 160 are similar.

The host I/O buffer 140 provides a buffer which utilizes an XD_P[0...7] bi-directional host data bus 150 connected to a conventional host I/O bus such as an Industry Standard Architecture (ISA) bus as is well understood in the art. An XDO[0...7] output signal bus 152 carries a set of signals from the peripheral controller 103 for output onto the XD_P[0...7] host data bus 150, and an XDIN[0...7] input signal bus 154 carries signals to the peripheral controller 103 from the XD_P[0...7] host data bus 150. The core I/O buffer 160 also uses an XD_OE enable signal line 156 to gate signals on the XDO[0...7] signal bus 152 to the XD_P[0...7] host data bus 150.

Any data from the host on the XD_P[0...7] host data bus 150 will propagate through the buffer onto the XDIN[0...7] signal bus 154 for use within the peripheral controller 103.

The core I/O buffer 160 provides a tri-state buffer for the core CPU 104. The core I/O buffer 160 utilizes an AD_P[0...7] bi-directional address/data bus 172 connected to the core CPU 104 Port 0 (corresponding to Port 0 of an Intel 80C31) as is well understood in the art. An AD[0...7] output signal bus 174 carries signals from the peripheral controller 103 for output to the core CPU 104, and an ADIN[0...7] input signal bus 176 carries signals from the core CPU 104 for input to the peripheral controller 103. An active AD_OE signal line 178 allows the signals on the AD[0...7] signal bus 174, propagate through the buffer to the AD_P[0...7] address/data bus 172.

When the core CPU 104 places data on its Port 0 data lines, the signals propagate through the core I/O buffer 160 to the ADIN[0...7] signal bus 176 for use by the peripheral controller 103.

The Host I/O Control Circuit

The peripheral controller 103 requires a number of control signals. Many of these signals are provided by the host I/O control 122, depicted in FIG. 4. The host I/O control is relatively straight forward and will be explained in functional form.

The host I/O control 122 utilizes signals on an XIOW_ (I/O write) signal line 264, an XCS_ (chip select) signal line 224, a CLKIN (CLOCK) signal line 226, an XIOR_ (I/O read) signal line 228, an XA2 (address line 2) signal line 200, and a RESET_ signal line 216. These signals are the standard I/O write, I/O read, chip select for the conventional 8042 or 8742 peripheral controllers, clock, and reset control signals from the host 102 as are well understood in the art.

The interface control 122 also uses a MIBF (mask input buffer full flag) signal line 270, and a BOOT (core is executing boot load) signal line 271.

The interface control 122 provides an SIBF (set input buffer full) signal line 210, an HWRP_ (host write pulse) signal line 260, an HWR_ (host write) signal line 202, a WR60_ (host write to port 60) signal line 229, a WR64_ (host write to port 64) signal line 230, an IA2 signal line 232, an HRD_ (host read) signal line 234, a RD60_ (host read from port 60) signal line 236, a RD64_ (host read from port 64) signal line 235, and the XD_OE signal line 156.

The HWRP_ signal line 260 is driven active by any write to port 60 or to port 64 by the host 102 (the XIOW_ signal line 264 and the XCS_ signal line 224 are active). The HWR_ signal line 202 is driven active under the same conditions as the HWRP_ signal line 260, but three clock cycles after the HWRP_ signal line 260 goes active. The SIBF_ signal line 210 is driven active upon a write to port 60 or to port 64 by the host 102 (the XIOW_ signal line 264 and the XCS_ signal line 224 are active) when the MIBF signal line 270 is not active (the input buffer full flag is not masked), and the BOOT signal line 271 is not active (the controller 103 is not downloading). The WR60_ signal line 229 is active whenever the host executes a write to port 60 (the XIOW_ signal line 264 is active, the XCS_ signal line is active, and the XA2 signal line 200 is low). The WR64 signal line 230 is active when the host 102 writes to port 64 (same as WR60_, except the 32 signal line 200 is high). The IA2 signal line reflects the signal on the XA2 signal line when the XIOR_ signal line 228 and the XCS_ signal line 224 are active. The HRD_ signal line 234 is driven active upon a read from port 60 or from port 64 by the host 102 (the XIOR_ signal line 228 and the XCS_ signal line 224 are active). The XD-OE signal line 156 is activated under the same conditions as the HRD_ signal line 234, but three clock cycles after the HRD_ signal line goes active. The RD60_ signal line 236 is activated when the host 102 executes a read from port 60 (the XIOR_ signal line 226 and the XCS_ signal line are active, and the XA2 signal line is low), and the RD64_ signal line 235 is activated by a read from port 64 by the host 102 (the XIOR_ signal line 226, and the XCS_ signal line are active, and the XA2 signal line is high).

The Host Register Buffers

The host register buffers circuit 123 comprises multiplexer logic 194 and an input register latch 240 as depicted in FIG. 5.

The multiplexer logic 194 utilizes an ST[0 . . . 7] status register data bus 242, an OB[0 . . . 7] output register data bus 244, and is responsive to the XA2_ signal line 200, the HRD_ signal line 234, and the RESET_ signal line 216, and selectively transmits data on the XD[0 . . . 7] signal bus 151. The OB[0 . . . 7] output register data bus 244 corresponds to the output register of an Intel 8042 or 8742 peripheral controller, and the ST[0 . . . 7] status register data bus 242 corresponds to the status register of an Intel 8042 or 8742 peripheral controller.

The multiplexer logic 194 selects propagation of signals from the OB[0 . . . 7] output register data bus 244 or from the ST[0 . . . 7] status register data bus 242 to the XD[0 . . . 7] signal bus 152. When the XA2 signal line 200 is high, the ST[0 . . . 7] status register data bus 242 is selected for propagation. When the XA2 signal line 200 is low the OB[0 . . . 7] output register data bus 244 is selected for propagation. An active HRD_ signal line 234 gates the selected signals through the multiplexer 194

The input buffer latch 240 has its inputs connected to the XDIN[0 . . . 7] signal bus 154 and is controlled by the HWRP_ signal line 260. The outputs of the input buffer latch 240 are connected to an IB[0 . . . 7] input register data bus 246. The IB[0 . . . 7] input register data bus 246 corresponds to the input register of an Intel 8042 or 8742 peripheral controller. The signals on the XDIN[0 . . . 7] signal bus 154 are gated through the buffer 240 to the IB[0 . . . 7] input register data bus 246 when the HWRP_ signal line 260 is active.

The Core Address/Data Latches

Figure 6:
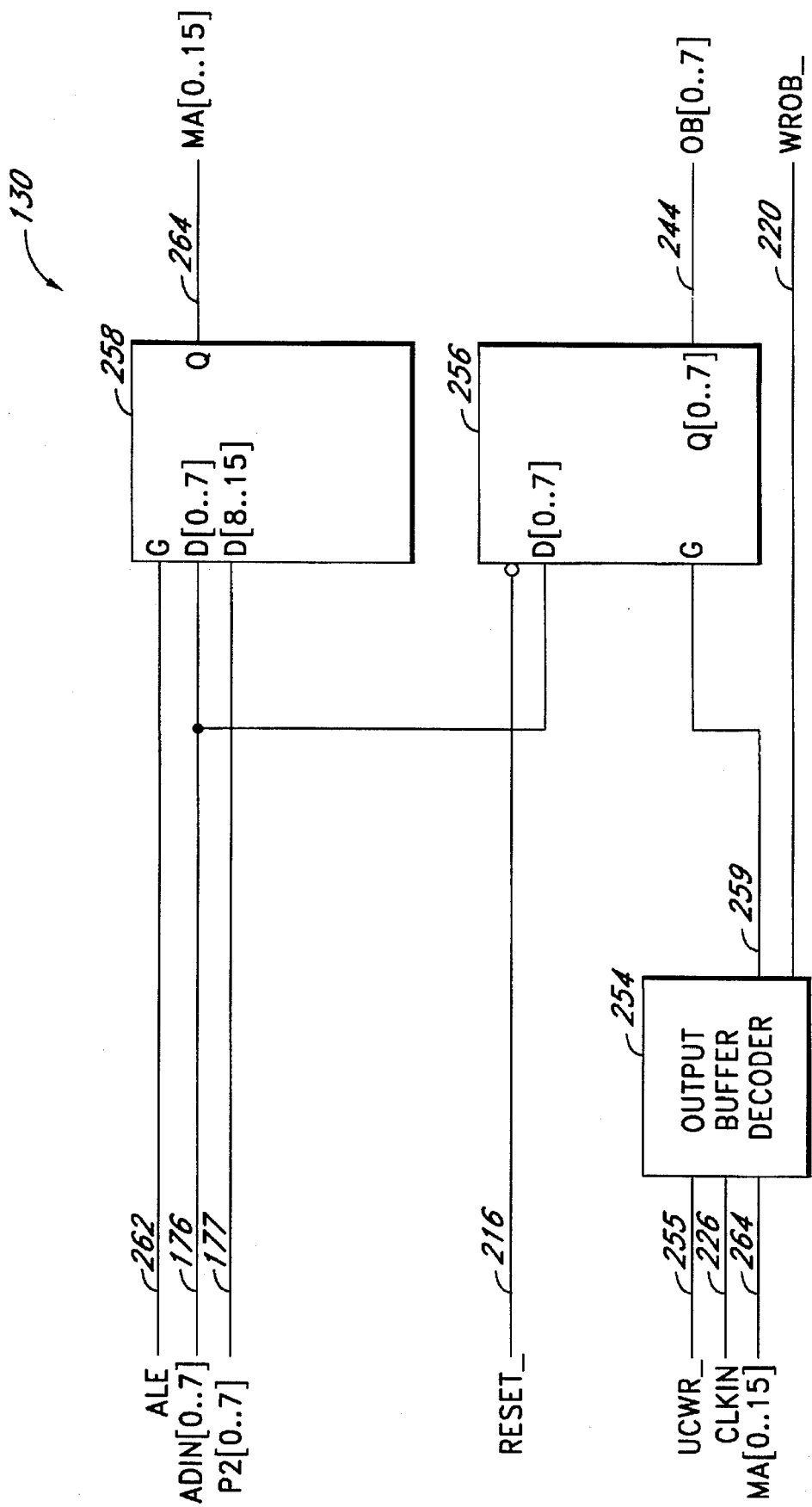
FIG. 6 illustrates the address/data latch for the microcontroller core central processing unit (core CPU).

The core CPU address/data latches 130 comprises an output buffer decoder 254, an output buffer latch 256, and an address latch 258 as depicted in FIG. 6. In the present embodiment, the output register is mapped into the core CPU 104 memory space at location 8010H.

The inputs to the address latch 258 comprise the ADIN[0 . . . 7] signal bus 176, and a P2[0 . . . 7] signal bus 177 from port 2 on the microcontroller core CPU 104 as well known in the art. The address latch 258 is controlled by an ALE signal line 262 from the core CPU 104 as is well understood in the art, and the RESET_ signal line 216. When the address latch 258 detects an active signal on the ALE signal line 262, it allows propagation of the signals on the ADIN[0 . . . 7] signal bus 176 and the signals on the P2[0 . . . 7] signal bus 177 to a MA[0 . . . 15] address line bus 264.

The output buffer decode logic 254 utilizes a UCWR_ signal line 255 (core CPU write control line well understood in the art), the CLKIN signal 226, and the MA[0 . . . 15] address bus 264 to detect a write to address location 8010H by the microcontroller core CPU 104. The decoder 254 drives a WROB_ (write output buffer) signal line 220 active and an OBG (output buffer gate) signal line 259 active upon detecting the write to 8010H (a write to the output buffer) by the core CPU 104. The OBG signal line 259 is activated three clock cycles before the WROB signal line 220.

The output buffer latch 256 utilizes the ADIN[0 . . . 7] signal bus 176 and the OBG_ signal line 259. When the output buffer latch 256 detects an active signal on the OBG signal line 259, indicating a write to the output register by the core CPU 104, it allows propagation of the signals on the ADIN[0 . . . 7] signal bus 176 to the OB[0 . . . 7] output register data bus 244.

The Status Register

Figure 7:
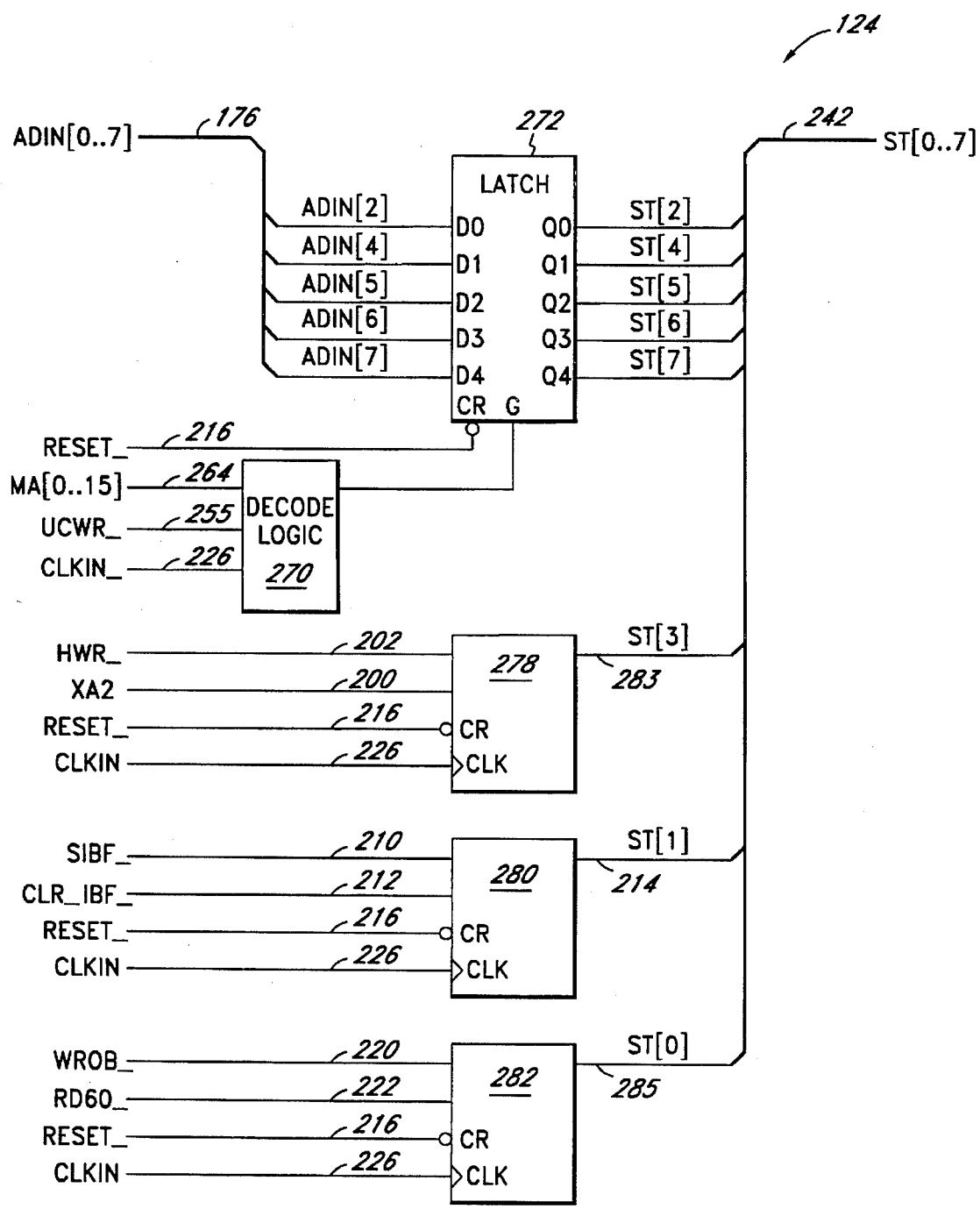
FIG. 7 illustrates the data bus status register.

The status register 124 corresponds to the status register of an INTEL 8042 or 8742 peripheral controller as well known in the art. The status register 124 is an eight-bit (bits 0–7) register which consists of 8 status bit lines, ST[0 . . . 7], and comprises a status register decoder 270, a latch logic 272, and status bit logic circuits 278, 280, and 282 as depicted in FIG. 7.

The status register decoder 270 responds to the UCWR_ signal line 255 and the MA[0 . . . 15] address bus 264. The status register 124 is mapped into the microcontroller core CPU 104 memory space at location 8012H. The decoder 270 responds to a write by the microcontroller core CPU 104 to address 8012H (the status register) to enable the latch logic 272.

The latch logic 272 responds to data inputs ADIN[2], and ADIN[4 . . . 7] from the ADIN[0 . . . 7] signal bus 176 and provides signal lines ST[2], ST[4 . . . 7] corresponding to status bit 2, and bits 4–7 of the status register 124. The latch logic 272 gates the signals on the ADIN[2], ADIN[4 . . . 7] lines to the ST[2], ST[4 . . . 7] signal lines when enabled by the status register decoder 271 as explained.

Status bit 3 logic 278 responds to the XA2 signal line 200, the HWR_ signal line 202, the CLKIN signal line 226 and the RESET_ signal line 216. The logic 278 provides a signal for an ST[3] status bit signal line 283. This ST[3] signal line 283 corresponds to the level on the XA2 signal line 200 upon a pulse on the CLKIN signal line 226 and the HWR_ signal line 202 line is active to indicate whether the last write from the host 102 to the input register was a command or data as well understood in the art. A high on the XA2 line indicates that the last write by the host to the input register was a command, and a low on XA2 indicates the last write by the host to the input register was data. The ST[3] signal line 283 is cleared when the RESET_ signal line 216 is activated.

Status bit 1 logic 280 is controlled by the SIBF__ signal line 210, a CLRIBF__ signal line 212, the RESET__ signal line 216, and the CLKIN signal line 226. The logic 280 drives an ST[1] signal line 214 upon a pulse on the CLKIN signal line 226 and an active signal on the SIBF__ signal line 210 (indicating a qualified host write to the input buffer). The logic 280 drives the ST[1] signal line 214 inactive upon a pulse on the CLKIN signal line 226 whenever the CLRIBF__ (indicating a read from address 8012H by the core CPU 104) signal line 212 is activated. The ST[1] signal line 214 is cleared when the RESET__ signal line 216 is activated.

Status bit 0 logic 282 utilizes the WROB__ signal line 220, the RD60__ signal line 236, the CLKIN signal line 226, and the RESET__ signal line 216. The logic 282 drives an ST[0] signal line 285 active upon a pulse on the CLKIN signal line 226 whenever the WROB__ signal line 220 is active (indicating that the core CPU 104 has written to the output register). The logic 282 drives the ST[0] signal line 285 inactive upon a pulse on the CLKIN signal line 226 when the RD60__ signal line 236 is active (indicating that the host 102 has read the output register). The ST[0]signal line 285 is cleared when the RESET__ signal line 216 is activated.

The ST[0 . . . 7] signal lines form the ST[0 . . . 7] status register data bus 242 and thus comprises the contents of the status register.

The Address Decoder

Figure 8:
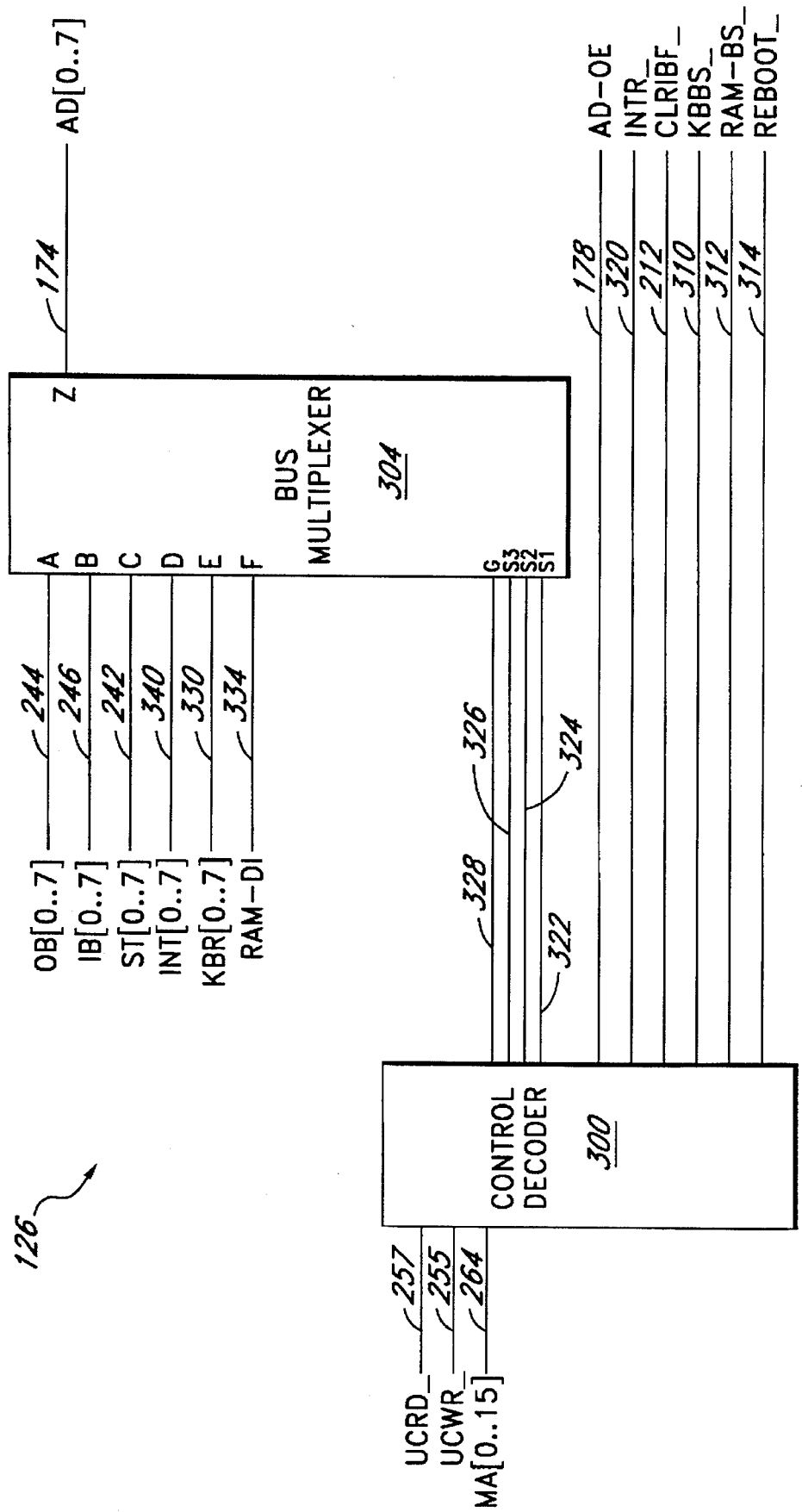
FIG. 8 illustrates the address decoder/bus multiplexer circuit for the microcontroller core.

The address decoder/bus multiplexer circuit 126 comprises a control decoder 300 and a bus multiplexer 304 as depicted in FIG. 8.

The control decoder 300 responds to the UCWR__ signal line 255, a UCRD__ (conventional Read from core CPU 104 as well known in the art) signal line 257, and the MA[0 . . . ] address bus 264. The decoder 300 detects accesses to predetermined addresses by the microcontroller core CPU 104 within its memory space. The decoder provides the CLRIBF__ (Clear input buffer full flag) signal line 212, a KBBS__ (keyboard bus select) signal line 310, a INTR__ (interrupt register) signal line 320, the AD__OE signal line 178, a RAM-BS__ (RAM bank select) signal line 312, a REBOOT__ signal line 314 (a software reset), and three multiplexer select signal lines 322, 324, 326 and a mux gate signal line 328.

The bus multiplex logic 304 responds to a KBR[0 . . . 7] keyboard row bus 330 connected to the rows of the keyboard 412, the OB[0 . . . 7] output register bus 242, the IB[0 . . . 7] input register data bus 246, the ST[0 . . . 7] status register data bus 242, an INT[0 . . . 7] interrupt register signal bus 340 connected to the interrupt register (explained later), and a RAM-DI[0 . . . 7] signal bus 334 connected to the data lines of an external random access memory (RAM) (not shown), In the present embodiment, the control decoder 300 detects a read command from the core CPU 104 at various addresses to activate the select lines 322, 324, and 326 to select propagation of signals on the busses 232, 262, 228, 340, 330, and 334 to the AD[0 . . . 7] signal bus 174. When a read from address 8010H (the output register memory mapped address) occurs, the control decoder 300 selects the OB[0 . . . 7] output register data bus 242 for propagation. When a read from address 8011H (the input register memory mapped address) occurs, the control decoder 300 selects propagation of the signals on the IB[0 . . . 7] input register bus 246, and activates the CLRIBF__ signal line 212. When a read from address 8012H (the status register memory mapped location) occurs, the decoder 300 selects propagation of the signals on the ST[0 . . . 7] status register data bus 242. When a read from address 8040H (the interrupt register memory mapped location) occurs, the decoder 300 selects propagation of signals on the INT[0 . . . 7] interrupt register data bus 340. When a read from address 800XH (the keyboard columns memory mapped address) occurs, the decoder 300 selects propagation of signals on the KBR[0 . . . 7] keyboard rows data bus 330. When a read from address (the first 16K of memory space for the core CPU 104) occurs, the decoder 300 selects the signals on the RAM-DI[0 . . . 7] bus 334 for propagation. When a read from 800XH, 8010H, 8011H, 8012H and 8040H occurs, the decoder activates the AD__OE bus 178 so the signals on the AD[0 . . . 7] signal bus 174 can propagate through the core I/O buffer 160 to the AD__P[0 . . . 7] address/data bus 172 connected to the microcontroller core CPU 104.

The decoder detects any access to location 8037H by the core CPU 104 to activate the REBOOT signal line 313 (a software reset). The decoder detects any access to address locations 0000H–3FFFH (the first 16K of memory space for the core CPU 104) to activate the RAM-BS__ (RAM bank select) signal line 311. The decoder 300 also detects any access to address 804xH to activate the INTR__ signal line 320, and detects a read from the core CPU 104 at location 800xH to activate the KBBS__ signal line 310.

The Keyboard Scanner

The keyboard scanner 108 provides a memory mapped keyboard scanner for the core CPU 104. The core can efficiently determine which key is pressed and generate a scan code for the host 102.

Figure 9:
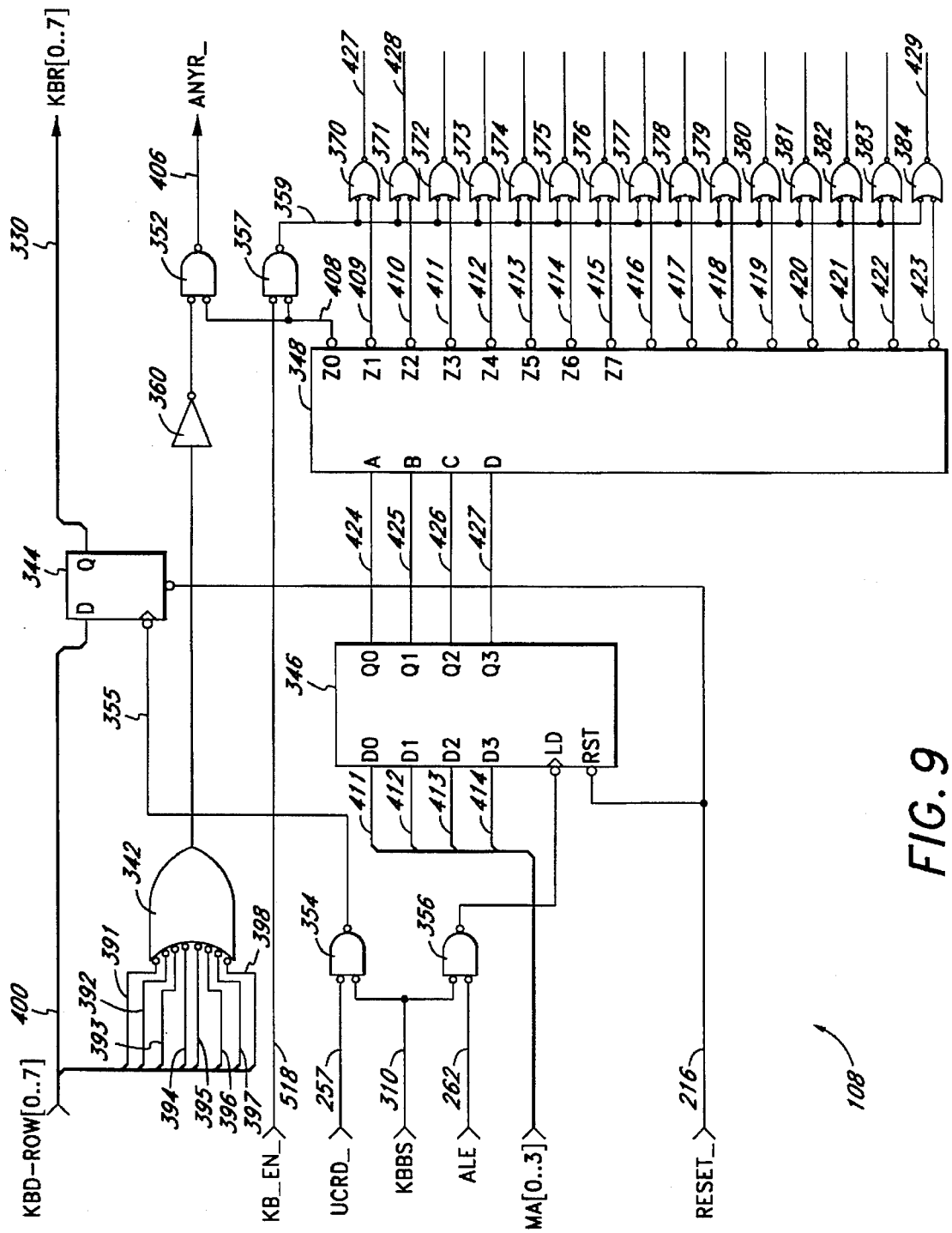
FIG. 9 illustrates a diagram of the keyboard scanner of the present invention.

The keyboard scanner, depicted in FIG. 9, comprises an OR gate 342, an input latch 344, a latch 346, a decoder 348, AND gates 352, 354, 356 and 357, and inverters 360, 364. It also includes OR gates 370–384, one OR gate for the decoder output 409–423.

Figure 10:
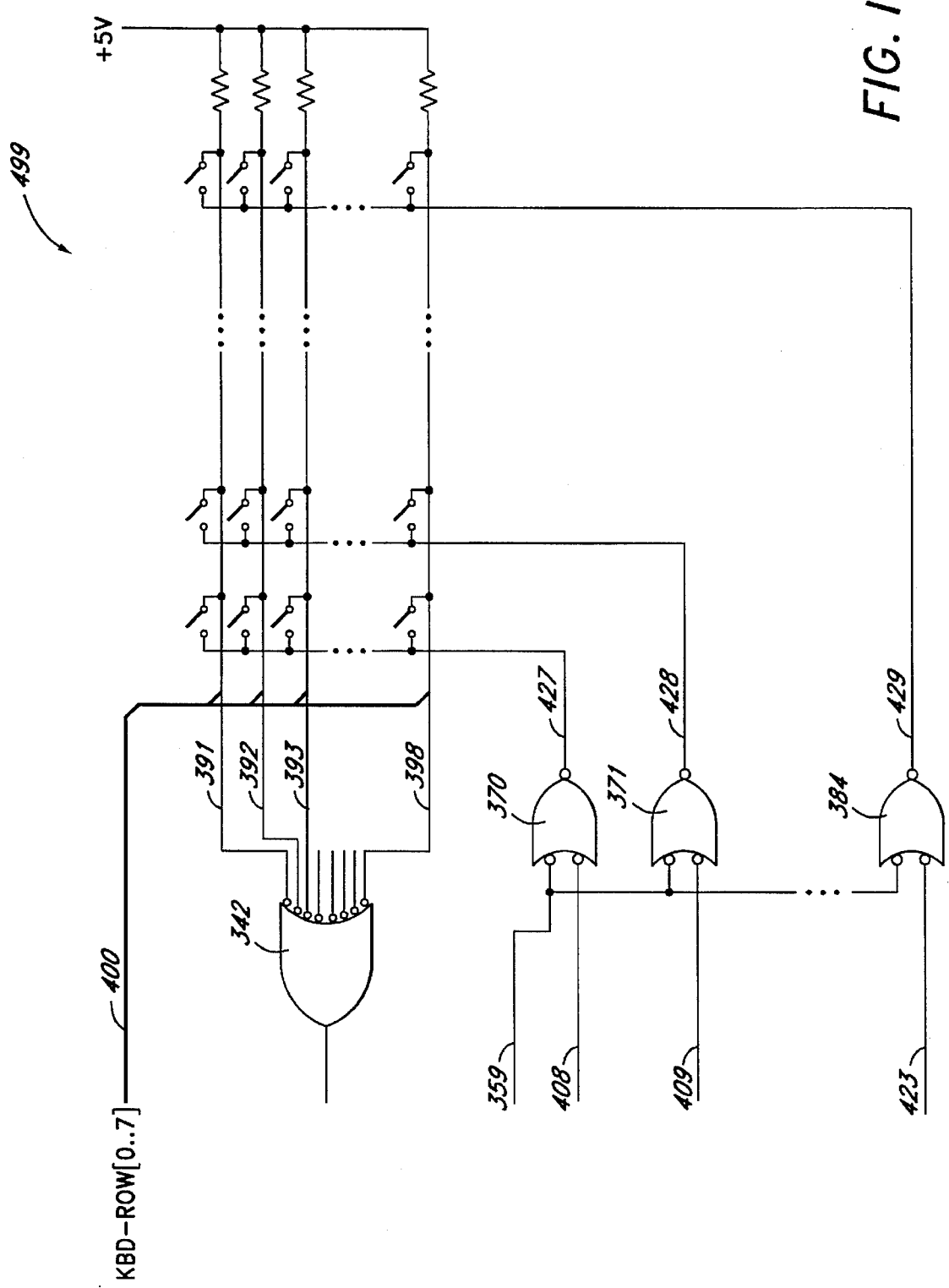
FIG. 10 illustrates an exemplary portion of the keyboard switch matrix of the present invention.

The keyboard scanner 108 utilizes a KBD-ROW[0 . . . 7] keyboard row signal bus 400 connected to the rows of a keyboard matrix as shown in FIG. 10 for four rows of the eight possible rows, a KB__EN__ (keyboard enable) signal line 516, the UCRD__ signal line 257, the UCWR__ signal line 255, the KBBS__ signal line 310, the ALE signal line 262, MA[0 . . . 4] address lines 411–414 from the MA[0 . . . 15] address bus 264, and the RESET__ signal line 216. The keyboard scanner 108 provides the KBR[0 . . . 7] keyboard row signal bus 330, and an ANYR__ signal line 406.

The keyboard scanner 108 is connected to a keyboard matrix 499 shown in part in FIG. 10. The keyboard matrix 499 is a switch matrix with rows and columns. The rows are combined in the OR gate 342 and also form the KBD ROW[0 . . . 7] signal bus 400. FIG. 10 of the keyboard switch matrix also shows the connections to three of the OR gates 370, 371 and 372 of the OR gates, 370–384 shown in FIG. 9. The keyboard matrix 499 columns 427, 428, and 429 are shown connected to the OR gates 370, 371 and 384. The remainder of the columns are connected to other OR gates in the same manner.

The Interrupt Controller

The interrupt controller 110 provides an interrupt register for the microcontroller core CPU 104 which is mapped into the core CPU 104 memory space at address location 8040H in the present embodiment.

Figure 11:
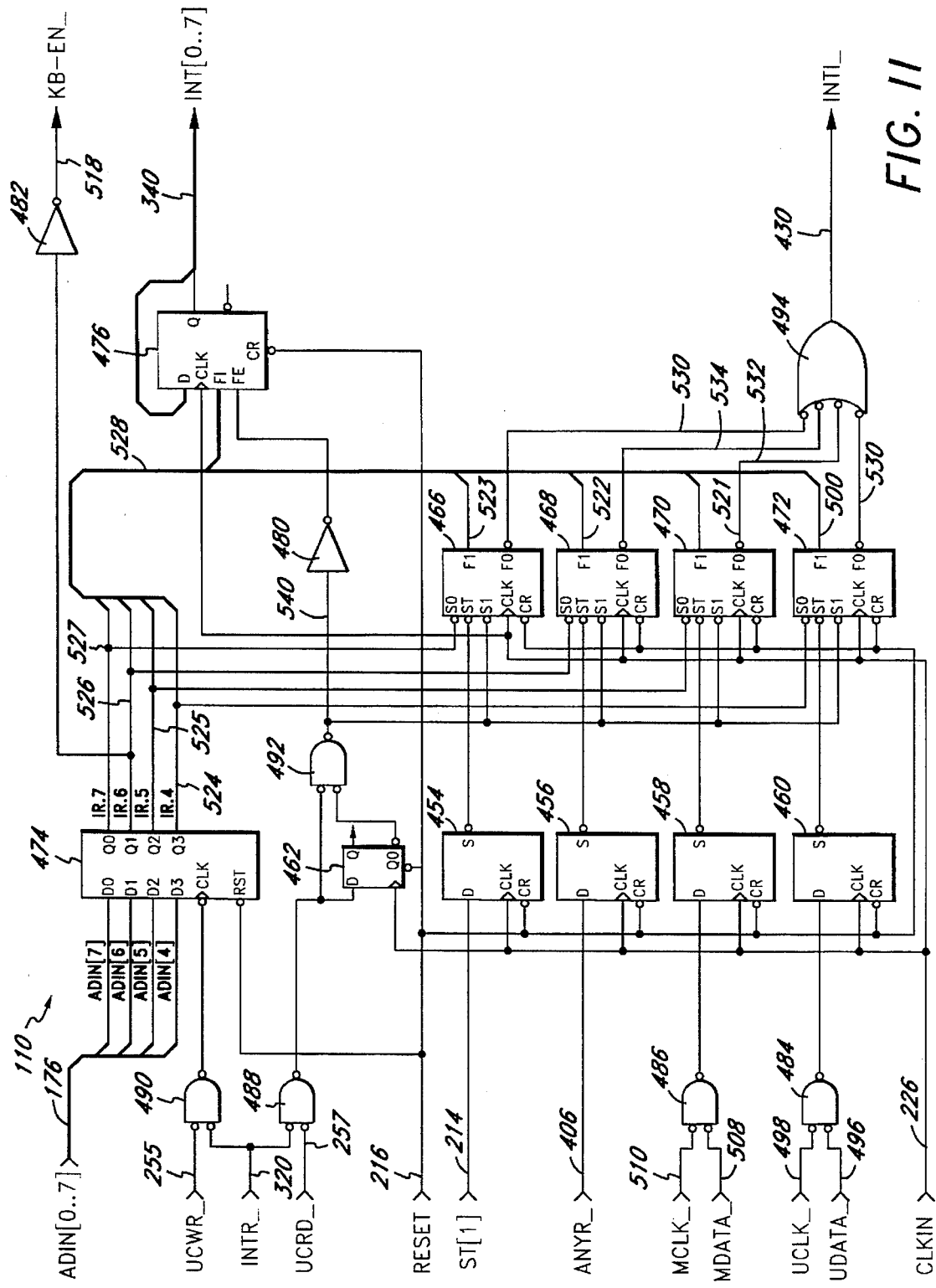
FIG. 11 illustrates a schematic diagram of the interrupt controller of the present invention.

The interrupt controller 110, depicted in FIG. 11, comprises latches 454, 456, 458, 460, 462, signal bit registers 466, 468, 470, 472, bus latches 474 and 476, inverters 480, and 482, AND gates 484, 486, 488, 490, 492, and a OR gate 494.

The register 110 is responsive to a conventional UDATA__ input signal line 496 and a conventional UCLK__ input signal line 498 (from a keyboard/mouse serial port as well understood in the art), an MDATA_ signal line 508 and an MCLK_ signal line 510 (from another keyboard/mouse serial port with a mouse connected as well understood in the art), the ANYR— signal line 406, an ST[1] signal line 214 from the ST[0 . . . 7] status register data bus 242, the RESET_ signal line 216, the CLKIN signal line 226, the INTR_ signal line 320, the UCWR_ signal line 255, the UCRD_ signal line 257, and the ADIN[0 . . . 7] signal bus 176.

The controller 110 provides the KB_EN_ (keyboard enable) signal 518, an INT1_ signal line 430 which provides an interrupt for the microcontroller core CPU 104, and the INT[0 . . . 7] interrupt signal bus 340 which provides the interrupt register.

Gate A20 Restart Command Bypasser

The conventional INTEL 8042 and 8742 peripheral controllers provide a signal to prevent propagation of address line 20 from an ISA address bus and a signal to indicate that the computer is switching from real to protected mode as well understood in the art.

These signals are referred to as the Gate A20 signal (for the address line 20 mask) and restart signal (for the signal indicating that the mode of the computer is changing) herein.

In the present invention, a gate A20 bypass controller 650 intercepts the command sequences from the host 120, well understood in the art, which would conventionally activate the GATEA20 and the RESTART_ signals. The Gate A20 bypass controller 650 provides these signals under hardware control to speed up operations.

The gate A20 bypass controller 650 comprises a decoder 660, latches 662, 664 a pulse generator 666, and an OR gate 668. The decoder responds to signals on the XDIN[0 . . . 7] signal line bus 154, the WR64_ signal line 230, the WR60_ signal line 229, the RESET_ signal line 216, and the CLKIN signal line 226. The latches 662, 664, the pulse generator 666 and the OR gate 668 respond to one or more of a POP-CMD signal line 670, a D1-CMD signal line 672, a NOP signal line 674, a FX-RST signal line 676, and a D1-DATA signal line 678 all controlled by the decoder 660, and the RESET_ signal line 216, the CLKIN signal line 226, and an XD[0] signal line 680 and an XD[1] signal line 682 from the XD[0 . . . 7] signal bus 154. The Gate A20 bypass controller 650 provides signals for a GATEA20 signal line 688, the RESTART signal line 692 and the MIBF signal line 270.

Boot Loader and RAM Controller

Figure 12:
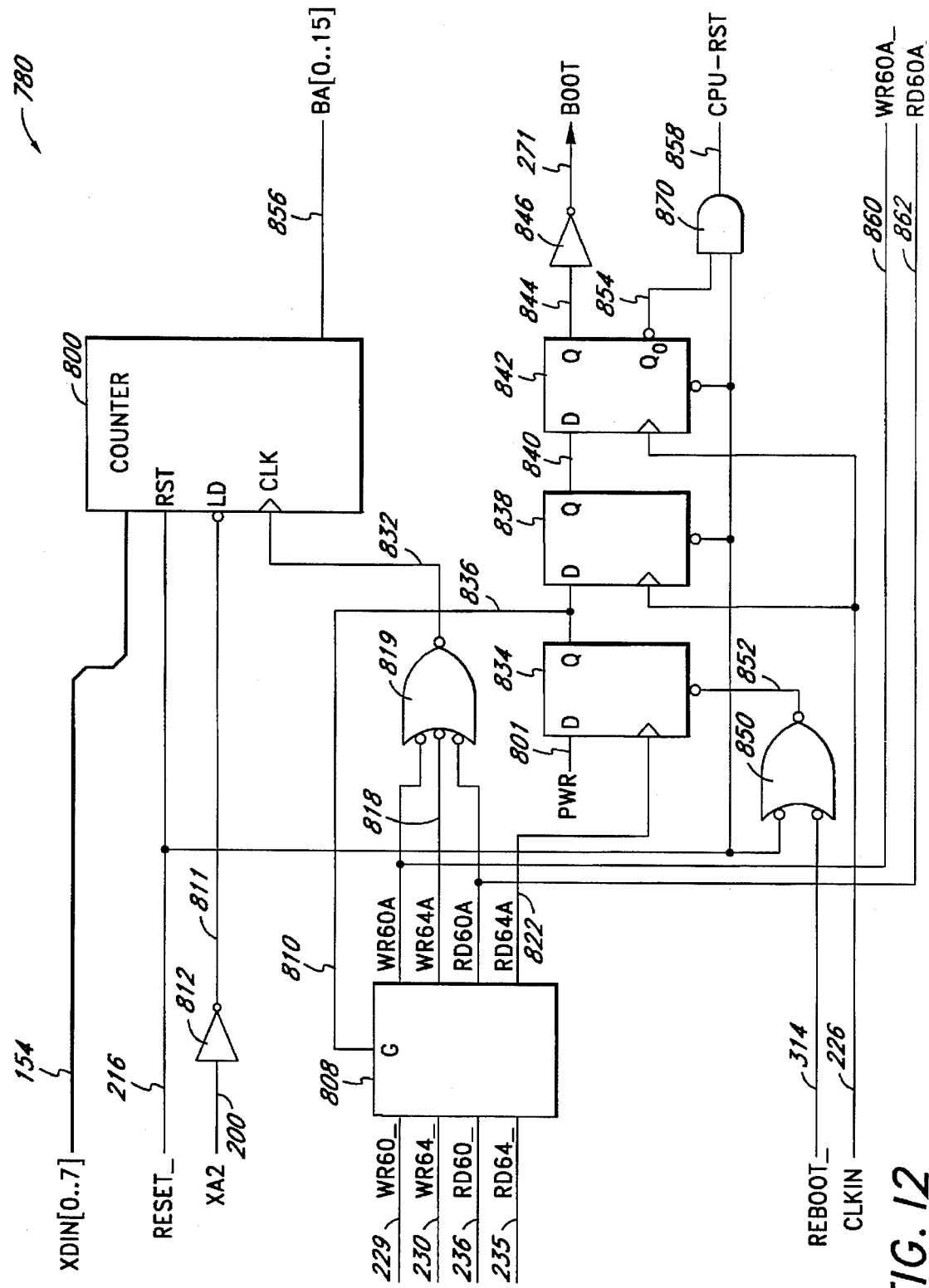
FIG. 12 illustrates a schematic diagram of the boot-loader circuit of the present invention.
Figure 13:
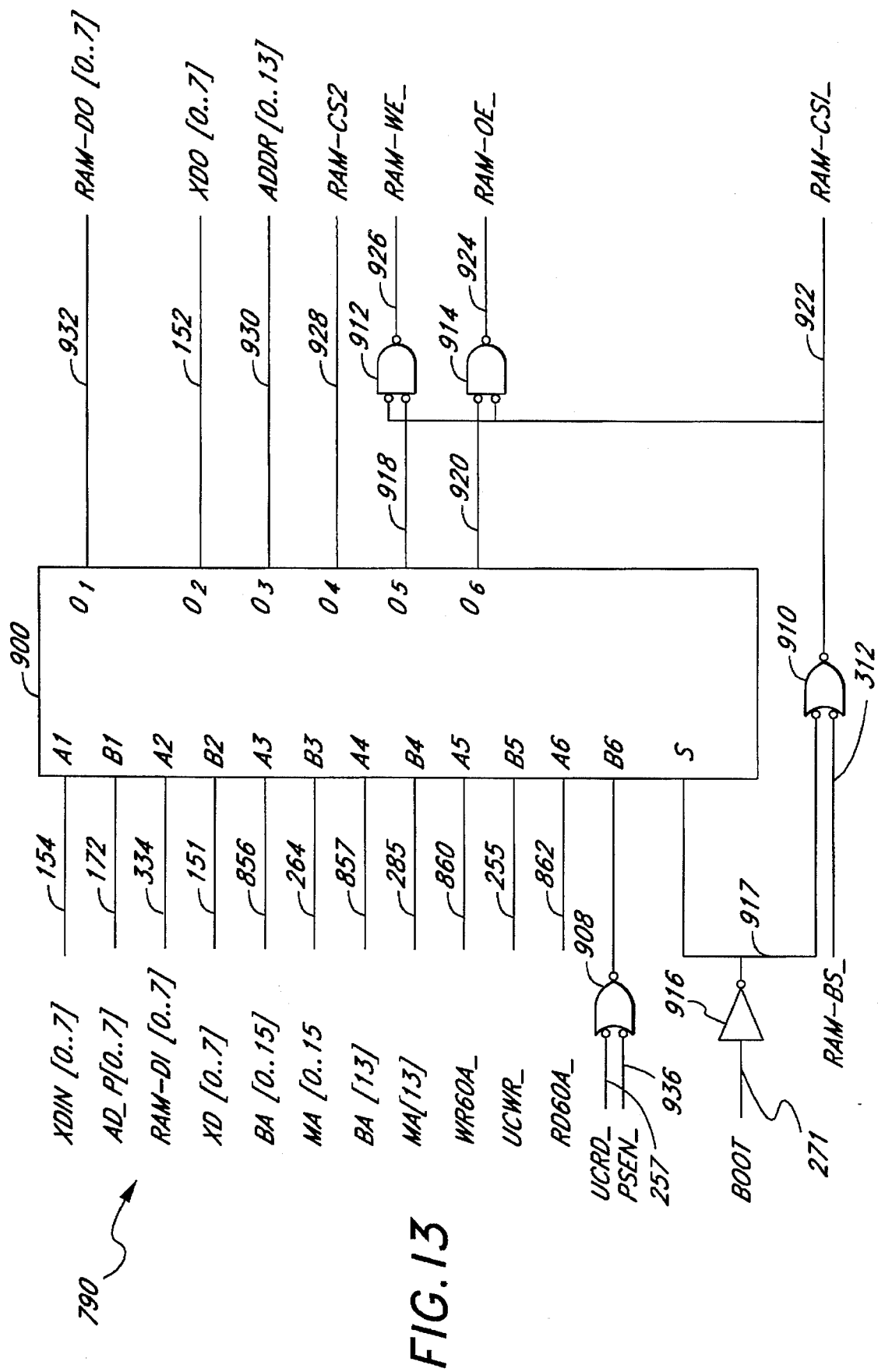
FIG. 13 illustrates a schematic diagram of the RAM controller of the present invention.

The peripheral controller 103 also includes a boot loader 780, depicted in FIG. 12, and a RAM controller 790 depicted in FIG. 13. The boot-loader 780 and the RAM controller 790 manage the downloading of programs to the peripheral controller 103 for use by the controller in its operations.

The boot loader 780 (FIG. 12) comprises a counter 800, a gate 808, OR gates 819, 850, an AND gate 870 latches 834, 838, and 842, and an inverter 846. The loader 780 is responsive to the XDIN[0 . . . 7] signal bus 154, the RESET_ signal bus 216, the WR60_ signal line 229, the WR64_ signal line 230, the RD60_ signal line 236, the RD64_ signal line 235, the CLKIN signal line 226, and the REBOOT_ signal line 314. The boot loader 780 provides a BA[0 . . . 15] address bus 856, the BOOT signal line 271, a CPU-RST signal line 858 (connected to the conventional RST pin on the core CPU 104), a WR60A_ signal line 860 which is activated on a write to port 60 by the host during boot-load, and a RD60A_ signal line 862 activated on a read from port 60 by the host 102 during boot load.

The RAM controller 790 (FIG. 13) provides interfacing between the peripheral controller 103 and the external Random Access Memory (RAM) (not shown). The RAM controller comprises multiplexing logic 900, AND gates 912, and 914, OR gates 908, and 910, and an inverter 916. The RAM controller responds to the XD-P[0 . . . 7] host data bus 150, the AD_P[0 . . . 7] core CPU address/data bus 172, a RAM-DI[0 . . . 7] (data lines from the RAM chip) signal bus 334, the XD[0 . . . 7] signal bus 151, the BA[0 . . . 7] address bus 856, the MA[0 . . . 15] address bus 264, the WR60A_ signal line 860, the UCWR_ signal line 255, the RD60A_ signal line 862, the UCRD_ signal line 257, a conventional PSEN_ signal line 936, the BOOT signal line 271, and the RAM-BS signal line 312.

The RAM controller 790 provides a RAM-DO[0 . . . 7] signal bus 932 connected to the external RAM data lines (not shown), an ADDR[0 . . . 13] address bus 930 connected to the external RAM address lines (not shown), a RAM-CS2 (selects lower or upper 8K of the 16K external RAM for access) signal line 928, a RAM-WE_ (write enable for the external RAM) signal line 926, a RAM-OE_ (RAM output enable for the external RAM) signal line 924, and a RAM-CS1_ (chip select for RAM which selects 16K bank of external RAM for access) signal line 922.

The Peripheral Controller Functions

The components of the peripheral controller 103 Just described combine to emulate the functions of a conventional peripheral microcontroller such as an INTEL 8042 or 8742.

The microcontroller core CPU 104 is programmed to manage the functions of the peripheral controller 103. The operation of the peripheral controller 103 is initiated by down-loading a set of instruction codes to the core CPU 104 external program/data RAM (not show). The peripheral controller then starts executing instructions which monitor all peripheral devices, such as the keyboard, an external mouse, and other peripherals. When no activity occurs for a pre-determined duration, the peripheral controller 103 initiates a power conservation mode of operation. This mode is entered by executing a HALT instruction in the core CPU 104. Any subsequent activity by the peripherals or host 102 generates an interrupt through the interrupt controller 110. The interrupt initiates execution of routines by the core CPU 104 in the peripheral controller 103.

The peripheral controller 103 host/core interface 106 provides an interface for the host 104 which can be connected to the standard host data and control busses as are well known in the art. The host interface utilizes input and output registers and a status register for communications with the host 102.

Input Register Accesses

Before the host 102 writes any data to the input buffer of the peripheral controller 103, it checks the status register to determine whether the input buffer is already full (contains data) or whether it is empty and available. The host 102 reads the status register 124 during a read from port 64 (as explained herein). When the host 102 receives the contents of the status register 124 it determines whether the ST[1] bit (input buffer full flag) is set. If the flag is not set, then the host 102 proceeds to write data to the input register of the peripheral controller 103. This protocol is well known in the art.

The input register is written by the host 102 during any write port 60 or to port 64 command. Data is written into this register even if the mask input buffer flag MIBF 270 is set. When the host 102 executes a write port 60 or to port 64 command, the XCS_ signal line 224 and the XIOW_ signal line 264 are active as well understood in the art. This in turn causes the control signal logic 252 to drive the HWRP__ signal line 260 active which gates the signals from the host on the XDIN[0 ... 7] signal bus 154 onto the IB[0 ... 7] input register bus 246 (FIG. 5).

The MIBF signal line is a mask which prevents the SIBF__ signal line 210 from being driven active, preventing the ST[1] signal line 214 from becoming active, and therefore, preventing the core CPU 104 from detecting that the input register has received data from the host 102. Thus, the host I/O control 122 drives the SIBF__ signal line 210 active only if the MIBF signal line 270 is not active as previously explained. The active SIBF__ signal line 210 is detected by the status bit 1 logic 280 which in turn sets the ST[1] status line 214 active.

The interrupt controller 110 receives the signal on the ST[1] signal line 214 which in turn propagates through the interrupt controller as explained below and generates an active signal on the INT1__ signal line 430.

The INT1__ signal line, which is connected to the core CPU 104 INT1 pin well understood in the art, causes an interrupt in the core CPU 104.

The core CPU 104 then determines what has caused the interrupt. The core CPU 104 determines this by reading the interrupt register from the INT[0 ... 7] interrupt data bus 340. To read the interrupt register, the core CPU 104 executes a read from address location 8040H to obtain the contents of the interrupt register. This read at 8040H produces signals on the INT[0 ... 7] interrupt register data bus 340 as will be explained in reference to the interrupt controller. The control decoder 300 also detects this address and selects propagation of the INT[0 ... 7] interrupt register data bus 340 through the bus multiplex logic 304 onto the AD[0 ... 7] signal bus 174 and drives the AD_OE signal line 178 active as previously explained. The active signal on the AD_OE signal line 178 enables propagation of the signals on the AD[0 ... 7] signal bus 174 through the core I/O buffer 160 to the AD_P[0 ... 7] core CPU address/data bus 172 and enables reading by the core CPU 104.

The core CPU 104 analyzes the contents of the interrupt register that it has received and determines which bit is active. In this case, the INT[3] bit will be active, indicating that the input register is full. The core CPU 104 then executes a routine in its memory to read the input register.

To read the input register which is mapped in the core CPU 104 memory space at 8011H, the core CPU 104 executes a read at address 8011H. This address is detected by the control decoder 300 which activates the select lines 322, 324, and 326 to allow propagation of the signals on the IB[0 ... 7] input register bus 246 through the bus multiplex logic 304 onto the AD[0 ... 7] signal bus 174. The decoder 300 also activates the AD_OE signal line 178 once again to allow the signals on the AD[0 ... 7] signal bus 174 to propagate through the core I/O buffer 160 onto the AD_P[0 ... 7] core address/data bus 172. The core CPU 104 then reads these signals into its accumulator as well understood in the art.

The control decoder detects the read from address 8011H to drive the CLR-IBF__ signal line 212 active. As explained, the CLR-IBF__ signal line 212 is detected by status bit logic 280 to clear the input buffer flag ST[1]so the host 102 can determine that it can execute another write to the input register by checking the status register 124.

Output Register Accesses

Before the core CPU 104 writes to the output buffer with data for the host 102, the core CPU checks the status register 124 to determine if the output buffer is full or empty. The core CPU reads the status register 124 by reference to the status register 124.

If the output buffer flag in the status register 124 is not set, then the core CPU 104 proceeds to write data for the host 102 to the output buffer.

In the present embodiment, the output register is mapped into the core CPU 104 memory space at location 8010H. The core CPU 104 writes to the output register by executing a write at location 8010H.

When the core CPU 104 writes to address location 8010H, the output buffer decode logic 254 detects the write at this address and activates the OBG signal line 259. This in turn selects propagation of signals on the ADIN[0 ... 7] signal bus 176 through the output buffer latch 256 onto the OB[0 ... 7] output register data bus 244. The output buffer decode logic 254 then activates the WROB__ signal line 220 which sets the ST[0] signal line active in the status register 124 to indicate that the output register is full.

The host 102 reads the status register 124 during a read to port 64 (as explained herein). When the host 102 receives the contents of the status register 124 it determines that the ST[0] bit is set.

The host 102 then proceeds to read the output register. The host reads the output register by executing a read from port 60. The read from port 60 causes the host I/O controller 122 to drive the HRD__ signal line 234 active which gates the signals on the OB[0 ... 7] output register data bus 244 onto the XD[0 ... 7] signal bus 151. The host I/O controller 122 also drives the XD_OE signal line 156 active which then allows the signals on the XD[0 ... 7] signal bus 152 to propagate through the host I/O buffer 140 onto the XD_P[0 ... 7] host data bus 150 which the host can read.

The core CPU 104 can also read the output register by reading from address location 8018H. The read at location 8018H is detected in the control decoder 300 which activates the select lines 322, 324, 326 to select the signals on the OB[0 ... 7] output register data bus 244 for propagation to the AD[0 ... 7] signal bus 174. The control decoder 300 will then activate the AD_OE signal line 178 to allow propagation of the signals on the AD[0 ... 7] signal bus 174 to the AD_P[0 ... 7] core address/data bus 172.

Status Register Accesses

In general, the eight bits in the status register 124 (FIG. 7) are defined as conventionally defined in an AT-compatible computer. The bits are defined as follows:

Bit 0=output buffer full flag (1=full);
Bit 1=input buffer full flag (1=full);
Bit 2=system flag (0=power on, 1=TestOk);
Bit 3=XA2 Status Flag (0=data, 1=command);
Bit 4=inhibit switch; Bit 5=transmit time out;
Bit 6=receive time out; Bit 7=parity error (0=odd, 1=even).

The core CPU 104 reads or writes to the status register bit 2, and bits 4–7 by reading or writing to address 8012H. During a write to address location 8012H by the core CPU 104, the status register decoder 270 detects the write to this address and gates the ADIN[2], and ADIN [4–7] signal lines to the ST[2], and ST[4 ... 7] signal lines of the ST[0 ... 7] status register data bus 242. Bits 0, 1, and 3 of the status register are controlled directly by hardware.

Bit 0 is set when the microcontroller core CPU 104 writes to address location 8018H and is cleared when the host 102 executes a read port 60 command. When the core CPU 104 writes to address 8018H, the output buffer decode logic 254 detects this address and drives the WROB_ signal line 220 active, which is detected by the status bit logic 282 which in turn drives the ST[0] signal line 285 active (the output buffer full flag is set). When the host 102 executes a read from port 60, the host I/O control 122 detects this read and drives the RD60_ signal line 236 active which is detected by the status bit logic 282 which drives the ST[0] status line 285 inactive (this clears the output buffer flag).

Bit 1 of the status register is set when the host 102 executes a write to port 60 or to port 64, and is cleared when the core CPU 104 reads from address 8011H (the input register). When the host writes to the input register (write to port 60 or to port 64) regardless of whether the signals constitute data or a command, the host I/O control 122 drives the SIBF_ signal line 210 active. The status bit logic 280 detects the active SIBF_ line 210 and drives the ST[1] status bit line 214 active (sets the input buffer full flag).

When the core CPU 104 reads the information in the input register by executing a read at address 8011H, the control decoder 300 activates the CLRIBF_ signal line 212. The status bit logic 280 detects the active CLRIBF_ signal line 212 and the ST[1] line 214 goes inactive (the input buffer full flag is cleared).

Bit 3 is updated on any input register write by the host 102 (write to port 60 or to port 64), and reflects the state of the host address bit two, (the XA2 signal line 200) during the last write port 60 or write port 64 command. A write to port 60 is a write to the input register with data, and a write to port 64 is a write to the input register with a command.

When the host 102 writes to the input register through a write to port 60 or to port 64, the host I/O control 122 drives the HWR_ signal line 202 active. This gates the XA2 signal line 200 through the status bit logic 188 onto the ST[3] status bit signal line 283.

The status register 124 is read by the host 102 during a read from port 64. When the host executes a read port 64 command, the host I/O control 122 activates the HRD_ signal line 234 and the XA2 signal line 200 will be high. The high on the XA2 line 200 selects the signals on the ST[0 . . . 7] status register data bus 242 for propagation through the mux 194, and the active HRD_ signal line 234 gates these signals onto the XD[0 . . . 7] signal bus 151. The host I/O control 122 then activates the XD OE signal line 156 to allow propagation of the signals on the XD[0 . . . 7] signal bus 151 through the host I/O buffer 140 to the XD_P[0 . . . 7] host data bus 150 for reading by the host 102.

Program Download Control

The peripheral controller of the present invention includes an external random access memory (RAM). The present embodiment includes 16K of (RAM). This external RAM is loaded with program code for the core CPU 104 operations. The RAM replaces the conventional read only memory (ROM) so that control routines for different peripheral devices can be implemented.

Figure 14:
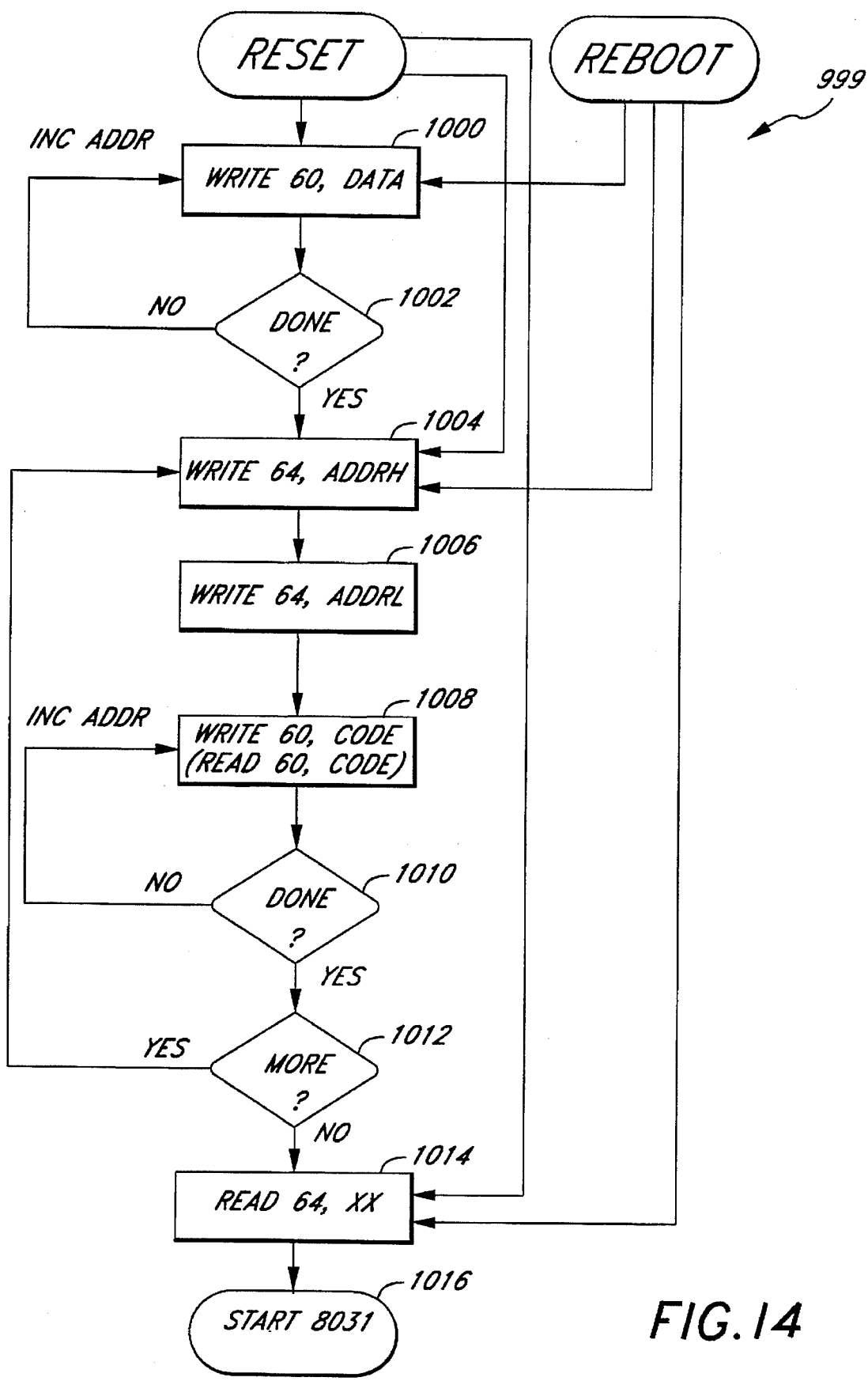
FIG. 14 illustrates a flow chart of an exemplary boot-load program sequence executed during boot-load of the microcontroller core.

Upon a power-up reset or a software reset initiated by an access by the core CPU 104 to address location 8037H (memory mapped reset address detected by the control decoder 300 to activate the REBOOT_ signal line 314, FIG. 8), the peripheral controller 103 begins boot-load. The flow chart 999 for an exemplary boot-load is shown in FIG. 14 and is described below.

During boot-load, the core CPU 104 is held in a reset state while the program code for the core CPU 104 is loaded into RAM. The boot-load sequence begins with the host 102 downloading interrupt vectors and look-up tables and other instructions into the RAM, followed by downloading program segments and service routines for the core CPU 104 in the RAM.

When the boot-load sequence is initiated, either the conventional RESET_ signal line 216 or the REBOOT_ signal line 314 is active depending on how the boot-load is initiated. The boot-loader 780 (FIG. 12) address counter 800 is reset by the active RESET_ signal line 216 and outputs an address 0000H on the BA[0 . . . 15] address line bus 856.

The active REBOOT_ line 314 or the active RESET_ line 216 causes the OR gate 850 to activate the signal line 852 and to reset the latch 834 to produce a low signal on the line 836. This signal propagates through the latch 838 and the latch 842 with consecutive pulses on the CLKIN signal line 226.

The signal from the latch 842 on the line 854 will be high and activates the AND gate 870 (the RESET_ line 216 will also have returned high—inactive) to drive the CPU-RST signal line active to hold the core CPU 104 in a reset state during boot-load.

The signal on line 844 also passes through the inverter 846 and results in an active high condition on the BOOT signal line 271. The signal on the BOOT signal line 271 propagates through the inverter 916 (FIG. 13) which causes a low condition on the multiplexer select line 917 to select the 'A' inputs in the mux circuit 900 to propagate through the multiplexer 900 to the various output signal lines from the multiplexer 900. This results in selecting the XD_P[0 . . . 7] host data bus 150 for propagation through the multiplexer 900 onto the RAM-DO[0 . . . 7] RAM data bus 932 which is connected to the external RAM. The RAM-DI[0 . . . 7] RAM output data bus 334 are selected for output on the XDO[0 . . . 7] signal bus 152. The address signals from the counter 800 on the BA[0 . . . 15] address line bus 856 is selected for propagation through the multiplexer 900 onto the ADDR[0 . . . 13] signal bus 930 connected to the RAM address lines (not shown). The signal on the BA[13] signal line 857 is also selected for propagation onto the RAM-CS2 signal line 928. The WR60A_ signal line 860 is selected for propagation through the multiplexer 900 onto the signal line 918. And the read 60A_ signal line 862 is selected for propagation onto the signal line 920. A high on RAM-CS2 selects the lower bank of RAM (0–8K), and a low on the RAM-CS2 928 signal line selects the upper bank of RAM (8K–16K).

The low on the signal line 917 also propagates through the OR gate 910 resulting in an active RAM-CS1_ signal line 922 which selects the first 16K of RAM as active. The active signal on the RAM-CS1_ signal line 922 enters the AND gate 912 to allow the signal on the signal line 918 to propagate through the AND gate 912 onto the RAM-WE_ signal line 926. The signal on the signal line 918 corresponds to the signal on the WR60A_ signal line 860 as explained. Thus, the signal on the RAM-WE_ signal line 926 corresponds to the signal on the WR60A_ signal line 860 during boot operations.

With the outputs from the RAM controller selected as explained, data from the host 102 on the XD_P[0 . . . 7] signal bus 150 propagates to the RAM_DO[0 . . . 7] signal bus. The addresses on the ADDR[0 . . . 13] signal bus 930 are provided by the boot-load counter 800 via the BA[0 . . . 15] signal line bus 856, and RAM-WE_ signal line 926 corresponds to the signals on the WR60A_ signal line 860. The RAM-CS1_ signal line 922 is active and the RAM-CS2 signal line 928 corresponds to the signal on the BA[13] signal line 857.

This allows the host 102 to write data or commands into the RAM at the address provided by the counter 800 by executing write port 60 commands. Each write to port 60 by the host results in an active signal on the WR60_ signal line 229, as previously explained. During boot-load the signal line 836 from the latch 834 is also low, as explained, which allows propagation of the signal on the WR60__ signal line 229 through the gate 808 to the WR60A__ signal line 860.

The active signal on the WR60A__ signal line 826 propagates to the RAM-WE__ signal line 926. Accordingly, when the external RAM receives the pulse on the RAM-WE__ signal line 926, it accepts the data on the RAM-DO[0 . . . 7] bus 932, which is the data from the host 102 as provided on the XD__P[0 . . . 7] host data bus 150, and stores the data into the address selected by the ADDR[0 . . . 15] address bus 930.

The active signal on the WR60A__signal line 826 also activates the OR gate 819 to produce an active signal on the count signal line 832 which increments the counter 800 by one. Thus, each write command will increment the counter 800 by one to automatically increment the address on the BA[0 . . . 15] address bus 856. When the addresses exceed 1FFFH (the first 8K of RAM) then the BA[13] signal line 857 will then become high to cause a low on the RAMCS2 signal line 928 to select the upper 8K of RAM (addresses 2000H–3FFFH).

The write to port 60 by the host 102 with data for the RAM continues until the necessary program code is loaded into the RAM, as represented in the action block 1000 and the decision block 1002 of FIG. 14.

Thus, the host 102 must also down-load the routines to the correct address locations. To accomplish this, the host 102 initializes the address in the counter 800 by writing to port 64 with the high 8 bits of the address followed by a write to port 64 with the low 8 bits of the address, as represented in action blocks 1004 and 1006, respectively.

The first write to port 64 causes the WR64A__ signal line 818 to go active. The active signal on the WR64A__ signal line 818 activates the OR gate 819 to activate the count signal line 832. The XA2 signal line 200 will be high (host access to port 64), and thus will be inverted in the inverter 812 to cause a low signal on the line 811, which loads the high eight bits of address on the XD__P[0 . . . 7] host data bus 150 into the high eight bits of the counter.

This write to port 64 is repeated with the low 8 bits of address on the XD__P[0 . . . 7] host data bus 150 which is loaded into the lower 8 bits of the counter 800.

The host then continues to load the program instruction segment at the appropriate address by executing write to port 60 commands, as represented by action block 1008, with the data to be loaded into the RAM in the same manner as discussed above, but with a new starting address. The counter 800 automatically increments the address locations for the RAM as explained above for downloading data to the RAM starting at address 0000H.

Once the host has completed loading all information such as the interrupt vectors program and look-up tables into the RAM, represented in decision block 1002, and the other program segments at various addresses throughout the RAM, represented in decision blocks 1010 and 1012, the host 102 terminates the download by executing a read port 64 command, as represented in action block 1014. The read from port 64 during boot load results in an active signal on the RD64A__ signal line 822. This latches a high signal from the PWR signal line 801 through the latch 834. This high signal propagates through the latch 838, the latch 842 and the inverter 846 and results in a low signal on the BOOT signal line 848. The low on the BOOT signal line 271 passes through the invert 916 and selects the B.0–6 inputs to the multiplexer 900 for propagation to the O.0–6 outputs. This selects the AD__P[0 . . . 7] core data bus 172, the XD[0 . . . 7] signal bus 151, the MA[13] signal line 285, the UCWR__ signal line 255, and either of the UCRD__ signal line 257, or the PSEN__ signal line 936 which are combined in the OR gate 908, for propagation through the multiplexer 900.

The signal line 854 returns to a low state which allows the AND gate 870 to become inactive, and the CPU-RST signal line 858 returns to an inactive state. This releases the core CPU 104 from its reset state. The core CPU 104 begins execution from address 0000H, as is well known in the art after a reset to the core CPU 104 as represented in action block 1016. The core CPU 104 then executes the downloaded instructions.

The host 102 can also execute any portion of the downloading sequence just described and as shown in the flow chart 999. The host can start at activity block 1000, 1004, or 1014 from either a standard reset or a reboot. For instance, the host may change a single routine anywhere in the RAM 109, or any piece of information located in the RAM 109.

The host 102 can also read the RAM 109 in a manner similar to the writing of the RAM 109 as explained. The reading requires that the host 102 execute a read from port 60 in activity block 1000 or activity block 1008, instead of a write to port 60 as explained.

The Interrupt Controller

As explained above briefly, the peripheral controller 103 can operate in a low power consumption mode. The core CPU 104 executes a HALT instruction after a predetermined time period has elapsed during which no events have been detected by the core CPU 104. In the halted state, the core executes no instructions and simply waits for an interrupt on one of its interrupt pins. This mode reduces power consumption of the controller 103.

The conventional peripheral controller actively polls various peripheral devices to determine if a device is requesting a data transfer. The present invention provides an interrupt controller to provide an interrupt 5 driven system so the controller can go into a low power mode. The present invention provides an interrupt controller which uses signals from the various peripherals and from the host 102 to generate a single interrupt for the core CPU 104 to activate the core CPU 104 from the low power mode. The individual interrupts from the various devices are read by the microcontroller core CPU 104 from the INT[0 . . . 7] interrupt register data bus 340 which is mapped into the microcontroller core CPU 104 memory space at location 8040H.

The interrupt controller 110 includes an eight-bit (IR.0–7) register reflected on the INT[0 . . . 7] interrupt register data bus 340. The bits are defined as follows:

IR.0=external peripheral interrupt occurred;

IR.1=external mouse interrupt occurred;

IR.2=keyboard matrix interrupt occurred (a key has been pressed);

IR.3=input buffer full interrupt occurred;

IR.4=mask/enable IR.0;

IR.5=mask/enable IR.1;

IR.6=mask/enable IR.2;

IR.7=mask/enable IR.3.

The interrupt mask bits IR.4–7 can be written by the microcontroller core CPU 104 by a write to address location 8040H to enable or disable interrupts from any or all of the interrupting devices. When the core CPU 104 executes a read or write to address location 8040H, the control decoder 300 detects this address and activates the INTR__ signal line 320. When the command is a write, the signal on the UCWR__ signal line 255 is active. The active signals on the INTR__ signal line 320 and the UCWR__ signal line 255 drives the AND gate 490 active. The active signal from the AND gate 490 in turn latches the signals from the signal lines ADIN[4 ... 7] from the ADIN[0 ... 7] signal bus 176 (the ADIN[0 ... 7] signal bus 176 will contain signals from the core CPU 104) through to the IR.4–7 signal lines 524–527 of the interrupt register signal bus 340. The signals on the IR.4–7 signal lines 524–527 act as enable or mask signals for the interrupt signals on IR.0–3 signal lines 530, 532, 534, and 536, respectively. Setting the mask bit to a high level enables the corresponding interrupt(s), and setting the mask bits to a low level masks the corresponding interrupt(s).

The IR.6 signal line 526 also serves to provide a signal on the KB-EN_ signal line 518, which in conjunction with the signal on signal line 408 is combined in the AND gate 357 to activate all keyboard columns. If the interrupt from the keyboard is masked (FR.6 signal line 526 is low), then the inverter 482 drives the KB_EN_ signal line 518 high which disables the keyboard as explained in reference to the keyboard scanner 108.

The IR.0–3 interrupts are controlled by hardware. The FR.0 signal line 530 is driven active when both the UCLK_ signal line 498 and the UDATA_ signal line 496 are active and interrupt 0 is enabled (the IR.4 signal line 524 is high). The UCLK_ signal line 498 and the UDATA_ signal line 496 are both active when a peripheral device connected to the corresponding serial port is activated, as well known in the art. Once these signal lines 496 and 498 go active, the AND gate 484 is activated, and the active signal from the AND gate 484 propagates through the latch 460 on the next pulse of the CLKIN signal line 226. The signal from the latch 456 then propagates to the register 472 and propagates to the IR.0 signal line 530 if the signal on the IR.4 signal line 524 is high (interrupt 0 is enabled) with the next pulse on the CLKIN signal line 220. Thus, whenever a peripheral connected to the serial port corresponding to the UCLK_ signal line 498 and the UDATA_ signal line 496 requests a data transfer, the IR.0 signal line 530 is driven active unless interrupt 0 is masked.

The interrupt 1 signal line 532 goes active when the MCLK_ signal line 510 and the MDATA_ signal line 508 both go active. These lines go active when a mouse peripheral device requests a data transfer. This occurs when the mouse is moved or a button on the mouse is pressed, as is well known in the art. When both the MDATA_ signal line 508 and the MCLK_ signal line 510 go active, the AND gate 486 is activated, and the signal from the AND gate 486 propagates through the latch 458 on the next pulse on the CLKIN signal line 226. If interrupt 1 is enabled (IR.5 signal line is high), then the signal from the latch 458 propagates through the register 470 to the IR.1 signal line 532 with the next clock pulse on the CLKIN signal line 226. Thus, when the mouse is activated, the IR.1 signal line 532 is driven active unless the interrupt 1 is masked.

The interrupt 2 signal line 534 is driven active when the ANYR_ signal line 406 is active. The ANYR_ signal line 406 is activated when a key is pressed on the keyboard as will be explained with respect to the keyboard scanner 108. When the ANYR_ signal line 406 goes active, the signal on this line propagates through the latch 456 on the first pulse on the CLKIN signal line 226. If interrupt 2 is enabled (the IR.6 signal line 526 is high), the signal from the latch 456 propagates through the register 468 on the next pulse on the CLKIN signal line 226 onto the IR.2 signal line 534. Thus, whenever a keypress occurs, the IR.2 signal line 534 is driven active unless interrupt 2 is masked.

The interrupt 3 signal line 536 is activated when the ST[1] signal line 214 from the status register 124 goes active. The ST[1] signal line 214 is activated when the host writes to the input register, as previously explained. The signal on the ST[1] signal line 214 propagates through the latch 454 with a pulse on the CLKIN signal line 226. If interrupt 3 is enabled (IR.7 signal line 527 is high), then the signal from the latch 454 propagates through the register 466 onto the interrupt 3 signal line 536 with the next pulse on the CLKIN signal line 226. Thus, when the host 102 writes to the input register and the ST[1] signal line 214 is activated, the IR.3 signal line 536 is activated unless interrupt 3 is masked.

Accordingly, the status of each interrupt bit is represented on the INT[0 ... 7] interrupt register data bus 340 which is read at location 8040H by the core CPU 104.

The IR.0 signal line 530, the IR.1 signal line 532, the IR.2 signal line 534 and the IR.3 signal line 536 are combined in the OR gate 494 to provide a signal on the INT1_ signal line 430. The INT1_ signal line 430 is connected directly to the INT1_ signal line 430 (not shown) of the microcontroller core CPU 104, as is well known in the art. If any one of the interrupt signal lines 530, 532, 534 or 536 becomes active, then the INT1_ signal line 430 is activated and generates an interrupt for the microcontroller core CPU 104.

When the microcontroller core receives the interrupt, it resumes its active mode, if it was in the halted mode. The core CPU 104 then determines which device has generated the interrupt. To determine which device has generated the interrupt, the microcontroller core CPU 104 reads the interrupt register (i.e., it executes a read to address 8040H which is the address assigned to the interrupt register). When the core CPU 104 executes the read to 8040H, the control decoder 300 detects this address and activates the INTR_ signal line 320. The INTR_ signal line 320 is combined with the UCRD_ signal line 257 in the AND gate 488. When both these signal lines 320, and 257 are active, the AND gate 488 is activated, and the signal from the AND gate 488 propagates through the AND gate 492 on a clock pulse on the CLKIN signal line 226 which latches the signal from the gate 488 through the latch 462 to the AND gate 492. When the AND gate 492 is active, the inverter 480 provides the signal to select the signals connected on the IR.0–7 interrupt signal lines 524–527 and 530–536 for propagation through the latch 476 onto the INT[0 ... 7] interrupt register data bus 340. The first pulse on the CLKIN signal line 226 will latch these signal onto the INT[0 ... 7] interrupt register data bus. When the signal from the inverter 480 returns inactive, one clock cycle later, this selects the signal lines connected to the 'D' input to the latch 476 from propagation through the latch 476. The 'D'=input is connected to the INT[0 ... 7] interrupt register data bus 340, thus the signals on this bus 340 are fed-back through the latch on subsequent pulses on the CLKIN signal line 226. Accordingly, the signals are maintained on the INT[0 ... 7] signal line bus until another read from the core CPU 104.

The control decoder 300, responding to the read at location 8040H, also activates the select lines 322, 324, 326 to select the signals on the INT[0 ... 7] interrupt register data bus 340 for propagation through the bus multiplex logic 304 onto the AD[0 ... 7] signal bus 174. The control decoder 300, responding to the read from 8040H, also activates the AD_OE signal line 178 which allows the signals on the AD[0 ... 7] signal bus 174 to propagate through core I/O buffer 160 to the AD_P[0 ... 7] core address/data bus 172 which connects to the core CPU 104 port 0 bus lines.

Once the core CPU 104 has the information on the INT[0 ... 7] interrupt register data bus 340, it can check this information to determine which bit is set. The core CPU 104 checks the status of bits 0, 1, 2, and 3 of this information.

Any bit that is high signifies that the corresponding device needs to transfer data. The core CPU 104 then executes a respective service routine to carry out communications with the device or devices, and transfer the necessary data. Each bit has an assigned interrupt vector for the core CPU 104 where the service routine for the respective device is located in the external RAM for the core CPU 104.

The read by the core CPU 104 at location 8040H also clears the interrupt register. The active signal from the AND gate 474 which resulted from the core CPU 104 read at location 8040H propagates via signal line 540 to each of the registers 466, 468, 470, 472 and the active signal clears these registers. An active signal on the RESET signal line 216 also clears these registers. Accordingly, the IR.0-3 signal lines 530, 532, 534 and 536, respectively, return to an inactive state and the INT1 signal line 430 also goes inactive.

The Keyboard Scanner

The keyboard scanner of the present invention differs from the conventional keyboard scanner in an IBM AT compatible system. In a conventional system, a separate integrated circuit continually scans the columns of a keyboard, and when a keypress is detected, the rows are individually read—the scanner activates one column and reads one row at a time to determine if a key has been pressed. Moreover, the scanner constantly monitors the keyboard to detect any keypresses. Once the scanner determines which key has been pressed, the scanner interprets the location of the key (or keys) that has (have) been pressed into a scan code by the host 102, as is well understood in the art. A common keyboard scanner is the INTEL 8049.

A conventional peripheral controller, such as an INTEL 8042 or 8742, actively polls the keyboard scanner periodically to obtain the scan codes generated by the keyboard scanner. This scanning and polling is an active process which continuously changes the signal levels on signal lines and thus consumes power. In a laptop computer, the use of multiple integrated circuits, operating in a constantly active mode, consumes more power than is desirable.

The present invention only scans the keyboard when the core CPU 104 receives an interrupt from the keyboard indicating that a key has been pressed. Moreover, the scanning is carried forth in a more efficient manner which allows the core CPU to read an entire column with one instruction.

In the present embodiment the keyboard comprises a switch matrix with fifteen columns and eight rows, as depicted in part in FIG. 10. The matrix columns are mapped into the external data memory space of the core CPU 104. The matrix activation address is 8000H to activate all columns in the matrix, and the keyboard columns can be individually activated when the core CPU 104 reads from addresses 8001H-800FH.

A read by the core CPU 104 from 8000H is detected in the control decoder 300, which drives the KBBS_ signal line 310 active. When the 8000H address is placed on the MA[0 . . . 15] address bus, the core CPU 104 pulses the ALE signal line 262. The active ALE signal line 262 and the active KBBS_ signal line 310 drives the AND gate 356 active which latches the signals on the MA[0 . . . 4] address lines 411-414 through the latch 346 onto the signal lines 424-426 to the decoder 348. The address to the decoder 148 will be 0H, which activates the signal line 408. This activates the AND gate 357 if the KB-EN_ signal line 518 is also active (the keyboard interrupt is enabled, as previously explained). This drives the signal line 359 active, which drives the outputs of the OR gates 370-384 active. This, in turn, pulls all the columns in the switch matrix 499 (FIG. 10) low. This leaves the keyboard matrix 499 columns in a state to generate an interrupt anytime a key is pressed on the keyboard.

The keyboard scanner 108 is connected directly to the KBD-ROW[0 . . . 7] signal bus 400 from the keyboard matrix 499, as seen in FIG. 10. The signal lines 391-398 in the signal bus 400 are active low. These signal lines 391-398 are combined in the OR gate 342. When a key is pressed and all columns are active, as explained, at-least one of these row signal lines 391-398 will be pulled low. The low on any one or more signal lines 391-398 generates a high on the signal line 399 from the OR gate 342, which is inverted to a low signal by inverter 360.

The signal line 408 is also low as explained. Accordingly, the AND gate 352 then generates an active signal on the ANYR_ signal line 406 which the interrupt controller 100 uses to provide an interrupt to the core CPU 104, as previously explained.

Once the core CPU 104 is interrupted and determines that the keyboard has generated the interrupt, as explained, it executes a keyboard service routine. In the service routine, the core CPU 104 begins scanning the keyboard columns by reading addresses 8001H-800FH until the key which has been pressed is found.

When the microcontroller core CPU 104 reads from an address in the 8001H-800FH range, the KBBS_ signal line 310 is activated by the control decoder 300 which detects any of these addresses (it detects addresses 800xH to activate the KBBS_ signal line 310). The KBBS_ signal line 310 is combined with the ALE signal line 262 in the AND gate 356, which results in a signal which latches the address on the MA[0 . . . 3] signal lines 411-414 from the MA[0 . . . 15] signal bus 284 through the latch 346, as previously explained. The signals from the latch 346 are provided to the decoder 348. A single column is activated because only one signal line 408-423 is activated by the decoder 348, corresponding to the address 8001H-800FH, and only one OR gate 370-384 is driven active to activate one column in the switch matrix 499.

The core CPU 104 then drives the UCRD_ signal line 257 active which combines with the active KBBS_ signal line 310 to activate the AND gate 354 and drive the signal line 355 high. This high signal on line 355 latches the signals on the KBD-ROW[0 . . . 7] bus 400 through the latch 344 onto the KBR[0 . . . 7] keyboard row signal bus 330. These signals represent the logic level of every row in the column activated.

The control decoder 300 will also activate the appropriate select lines 322, 324, 326 to select the KBR[0 . . . 7] keyboard rows data bus 330 for propagation through the bus multiplex logic 304 onto the AD[0 . . . 7] signal bus 174. The control decoder will also activate the AD_OE signal line 178, which will in turn allow propagation of the signals on the AD[0 . . . 7] signal bus 174 through the core I/O buffer 160 to the AD_P[0 . . . 7] core address/data bus 172 as previously explained for a read cycle by the core CPU 104.

If no signal from the KBR[0 . . . 7] signal bus 330 is low, then no key in any row in the column activated has been pressed. The core CPU 104 then executes a read at the address location of the next column, and reads the KBR[0 . . . 7] data bus 330 once again to determine if a key in the column newly activated was pressed. The core CPU 104 proceeds to activate one column at a time, read all rows in the column, and activate the next column, until the key pressed is located.

Each read of an entire column of rows is executed in one instruction by the core CPU 104. The instruction used is a MOVX A, @RI or a MOVX A, @DPTR (well known in the art) where RI or DPTR holds the column address and A is the accumulator of the core CPU 104. When the core CPU 104 executes this command, the signals on the KBR[0 . . . 7] keyboard rows data bus 330 will be read into the accumulator of the core CPU 104 for processing to determine if one of the rows in the respective column has a key pressed.

This memory mapped, interrupt driven keyboard scanner configuration is more efficient than conventional multiple chip, active scanning configurations, and requires less core CPU 104 processing time and consumes less power than the conventional configurations.

Gate A20 Bypass Controller

The gate A20 signal from a conventional peripheral controller is used to control address line 20 from an 80x86 microprocessor as is well understood in the art. During real mode operations, the signal masks signals on address line 20 from propagating. During protected mode operation, this signal is high, and therefore, allows propagation of the signal on address line 20. The Gate A20 signal is also high upon power-up of the computer.

Under the conventional implementation, the gate A20 signal provided from an Intel 8042 or 8742 integrated circuit is controlled by a Write Output Port (WOP) command from the 80x86 host microprocessor (i.e., a write to port 64 with a D1 hexidecimal (hex) value, followed by a write to port 60 with data, as is well understood in the art). The value of the gate A20 signal is controlled by the second least significant bit of the data included with the write to port 60 as is well understood in the art.

Properly written software issues a no operation (NOP) command following the WOP command and then begins polling the peripheral controller status register to determine when the NOP has been accepted, which indicates that the WOP operation is complete as is well understood in the art.

The value of the gate A20 signal may also be controlled by the Pulse Output Port (POP) command (a write to port 64 with an Fx hex value), but this results in unpredictable operation, and is therefore, not used to control the gate A20 signal line. This requires that POP commands, when second least significant bit is a 0, be prevented from controlling the gate A20 signal.

Figure 15:
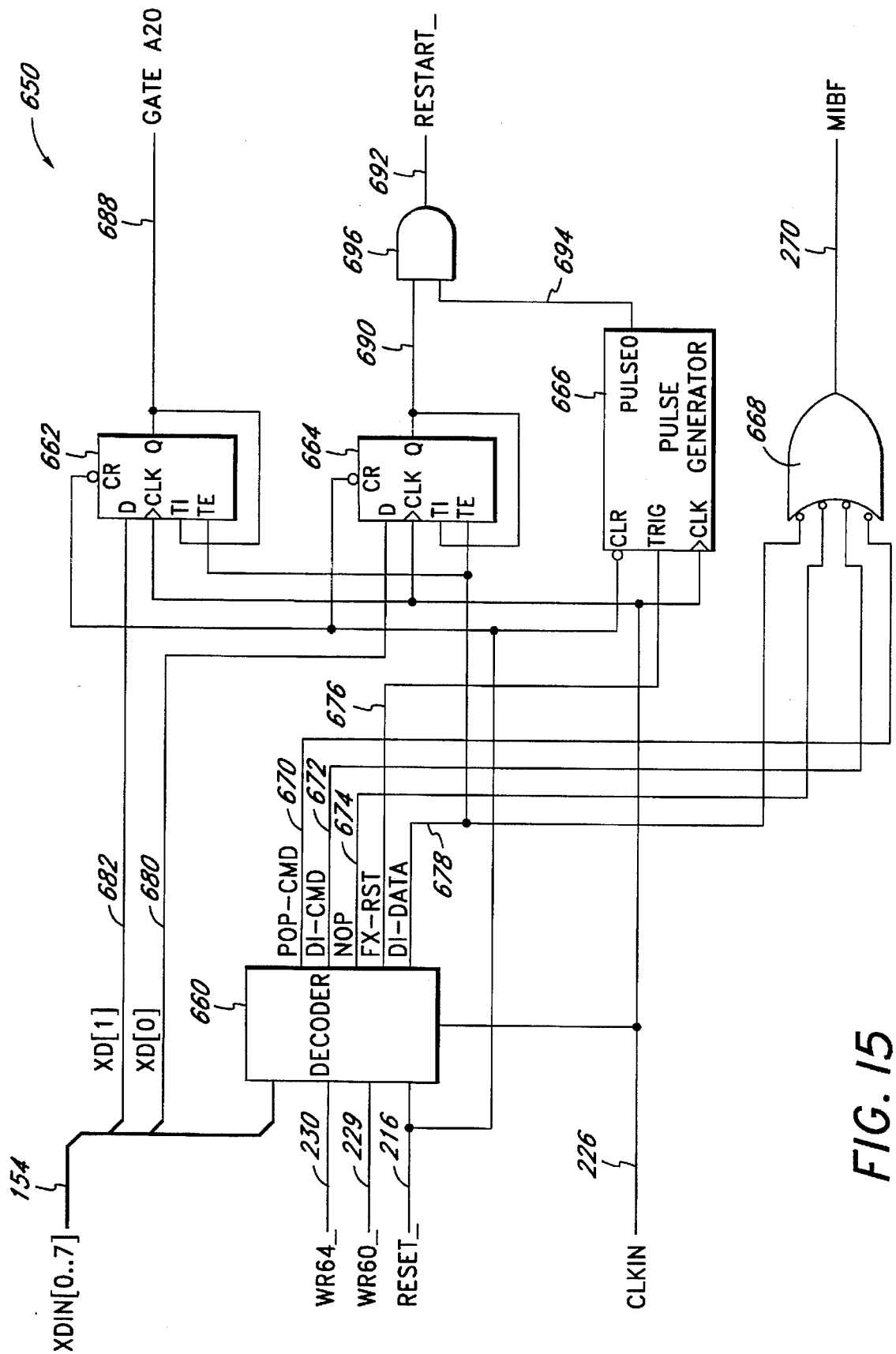
FIG. 15 illustrates a gate A20 bypass controller of the present invention.

According to the present invention, the GATEA20 signal line 688 is controlled by hardware instead of by the core CPU 104 (FIG. 15). The hardware detects and intercepts the command sequences which would normally control the gate A20 signal through the core CPU 104. The gate A20 bypass controller 650 provides the hardware to detect and intercept these command sequences and to prevent the core CPU 104 from receiving these command sequences.

The decoder 660 detects the first WOP command (write to port 64 with a D1 hex value) from the host 102 and activates the D1-CMD signal line 672. If the decoder 660 detects a write to port 60 (a write to the input register with data on the XDIN[0 . . . 7] signal line bus 154) by the host 102 following the write to port 64 just detected, the decoder activates the D1-DATA signal line 678. The active D1-DATA signal line 678 selects the 'D' input to the latch 662 which is connected to the XDIN[1] signal line 682 (the second least significant bit on the XDIN[0 . . . 7] signal bus 154). If the XDIN[1] signal line 682 is low, then the GATEA20 signal line 688 is driven low on the next pulse on the CLKIN signal line 226. If the XDIN[1] signal line 682 is high, then the GATEA20 signal line 688 is driven high on the next pulse on the CLKIN signal line 226.

The signal on the GATEA20 signal line 688 remains unchanged until the host 102 executes another WOP command sequence with a changed signal level on the XDIN[1] signal line 682. This results because the D1-DATA signal line 678 is only active for one clock cycle. Once the D1-DATA signal line 678 goes inactive, this selects the TI input to the latch 662. The TI input is a connected to the GATEA20 signal line 692 which is, therefore, fed-back through the latch 662 on subsequent pulses on the CLKIN signal line 226. Thus, the signal on the GATEA20 signal line 692 remains unchanged until the 'D' input is again selected with the WOP command sequence discussed.

As explained, well written software executes a NOP (a write to port 64 with FF hex). The decoder 660 detects the NOP, if it followed the write to port 60 with data just detected by the decoder, and activates the NOP-CMD signal line 674. This is also masked from the core CPU 104.

As explained, the gate A20 bypass controller 650 also detects the POP command and prevents it form controlling the GATEA20 signal line 688. The decoder 660 detects a POP command from the host 102 (a write to port 64 with Fx hex) when the second least significant bit of the data is a 0, and activates the POP-CMD signal line 670 to prevent further execution of this command by the core CPU 104 as explained herein.

The restart signal, well understood in the art, is an active low signal in the conventional design, and activates a CPU reset to the 80x86 microprocessor. This signal is inactive on power-up.

The restart signal is conventionally controlled by the POP command. The value of the restart signal is controlled by the least significant bit of the signal on the host data bus. The restart signal is also controlled by the WOP command sequence described above, except the restart signal is controlled by the least significant bit of the data included with the write to port 60 executed by the host 102.

According to the present invention, the decoder 660 detects the WOP command sequence as described above, and when the decoder activates the D1-DATA signal line 678, this activates the 'D' input from the latch 664. The 'D' input is connected to the least significant bit, the XDIN[0] signal line 680, of the XDIN[0 . . . 7] signal bus 154. The next pulse on the CLKIN signal line 226 latches the signal on the XDIN[0] signal line 680 to the signal line 690. If the XDIN[0] signal line 680 is low, then the AND gate 696 drives the RESTART_ signal line 692 active. The low signal on signal line 690 remains low until another WOP command with a high on the XDIN[0] signal line 680. This results because the D1-DATA signal line is only active for one clock cycle. Once the D1-DATA signal line 678 goes inactive, this selects the TI input to the latch 664, which is connected to the signal line 690. The signal on the signal line 690 is fed-back through the latch 664 on subsequent pulses on the CLKIN signal line 226. Thus, the signal on the signal line 690 remains unchanged until the 'D' input is again selected with a WOP command sequence as explained.

The RESTART_ signal line 692 is also activated upon a POP command from the host 102 when the XDIN[0] signal line 680 is low. The decoder detects the POP command when the XDIN[0] signal line 692 low, and activates the FX-RST signal line 676. When the decoder 660 activates the FX-RST signal line 676, connected to the pulse generator 666 trigger input, the pulse generator 666 produces an active low pulse for a predetermined duration, referenced to the CLKIN signal line 226, on the signal line 694 connected to the PULSE0 output of the generator 666. The pulse on the signal line 694 causes the AND gate 692 to activate the RESTART_ signal line 692 for a duration determined by the pulse generator 666 which initiates a reset in the host 102.

Because these operation are controlled by hardware in the gate A20 bypass controller 650, the core CPU 104 is prevented from executing these commands. If the decoder 660 activates any of the POP-CMD signal line 670, the D1-CMD signal line 672, the NOP-CMD signal line 674, or the D1-DATA signal line 678, which are combined in the OR gate 668, then the OR gate 668 produces an active signal on the MIBF signal line 270. The MIBF signal line 270, as previously explained, prevents the input buffer flag in the status register 124 from being set during a write to port 60 or to port 64 by the host 102. Accordingly, the interrupt controller 110 does not generate an interrupt for the core CPU 104. Therefore, the core CPU 104 does not read the input register and ignores these commands.

Although the applicant has described preferred embodiments, other embodiments of the present invention are obvious to those skilled in the art and do not detract from the subject matter regarded as the invention.

What is claimed is:

1. A keyboard controller for use with a computer keyboard matrix having columns and rows, said keyboard controller comprising:

a core microprocessor in communication with a host computer, said core microprocessor having at least one input/output port and at least one interrupt port, said core microprocessor having an active mode and a low power mode;

a plurality of keyboard instructions stored in memory and executable by said core microprocessor, said plurality of keyboard instructions comprising instructions for driving the keyboard matrix and for reading the keyboard matrix, wherein said core microprocessor does not execute said plurality of keyboard instructions in said low power mode and wherein less electrical power is consumed within said core microprocessor when said core microprocessor is in said low power mode than when said core microprocessor is in said active mode;

a plurality of keyboard column driver lines coupled to keyboard columns to selectively cause said keyboard columns to be driven at the same time;

a plurality of keyboard row sense signal lines coupled to the core microprocessor input/output port; and keyboard control logic having an output coupled to said at least one interrupt port of said core microprocessor, said keyboard control logic configured to generate an interrupt on said output if any key in said keyboard matrix is pressed, wherein if said core microprocessor is operating in said low power mode, said interrupt activates said core microprocessor to resume active mode operation and execute said keyboard instructions.

2. A keyboard controller for use in a host computer having a keyboard switch matrix with columns and rows, said keyboard controller comprising:

a core microcontroller in communication with said host computer, said core microcontroller having at least one input/output port and at least one interrupt port, said core microcontroller having an active mode and a low power mode, wherein less electrical power is consumed within said core microcontroller when said microcontroller is in said low power mode than when said core microcontroller is in said active mode;

a plurality of keyboard column driver lines coupled to keyboard columns to selectively cause said keyboard columns to be driven at the same time;

a plurality of keyboard row sense signal lines coupled in parallel for simultaneous reading by said input/output port; and keyboard scan logic having an output coupled to said at least one interrupt port of said core microcontroller, said scan logic configured to drive all of the columns active and configured to detect if any key is pressed while the columns are active, the scan logic generating an interrupt on said output to activate said core microcontroller to operate in said active mode, to scan said keyboard matrix, and to communicate a scan code representing the active switch in the matrix to the host computer.

3. A keyboard controller for use with a computer keyboard matrix having columns and rows, said keyboard controller comprising:

a core microprocessor in communication with a host computer, said core microprocessor having at least one input/output port;

a plurality of keyboard column driver lines coupled to keyboard columns to selectively cause said keyboard columns to be driven at the same time; and a plurality of keyboard row sense signal lines coupled in parallel for simultaneous reading by the core microprocessor input/output port when a key press has been detected.

4. A keyboard controller for use in a host computer having a keyboard switch matrix with columns and rows, said keyboard controller comprising:

a core microcontroller in communication with said host computer, said core microcontroller having at least one input/output port;

a plurality of keyboard row sense signal lines coupled in parallel for simultaneous reading by said input/output port; and keyboard scan logic configured to drive a plurality of the columns active at the same time and configured to detect if any key is pressed while the columns are active, the scan logic activating said core microcontroller to scan said keyboard matrix, and to communicate a scan code representing the active switch in the matrix to the host computer.

5. The keyboard controller of claim 1, wherein said plurality of keyboard instructions further comprise instructions for control of a mouse peripheral device.

6. The keyboard controller of claim 1, wherein said plurality of keyboard instructions further comprises instructions for a plurality of peripheral devices.

7. A method of detecting a keyboard switch closure in a host computer having a keyboard switch matrix with columns and rows, the method comprising the steps of:

first stimulating a plurality of said columns at the same time;

reading a plurality of said rows in parallel while said columns are stimulated to detect an active row; and when any of said rows is active then stimulating said columns sequentially to detect which column is active.

* * * * *